(12) United States Patent
Arifuku et al.

(10) Patent No.: US 12,365,118 B2
(45) Date of Patent: Jul. 22, 2025

(54) MANUFACTURING METHOD OF PROTECTIVE-COMPONENT-PROVIDED WORKPIECE

(71) Applicant: DISCO CORPORATION, Tokyo (JP)

(72) Inventors: Norihisa Arifuku, Tokyo (JP); Masamitsu Kimura, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 422 days.

(21) Appl. No.: 17/663,059

(22) Filed: May 12, 2022

(65) Prior Publication Data
US 2022/0362972 A1 Nov. 17, 2022

(30) Foreign Application Priority Data
May 14, 2021 (JP) .................... 2021-082720

(51) Int. Cl.
*B29C 35/08* (2006.01)
*B29C 39/00* (2006.01)
(Continued)

(52) U.S. Cl.
CPC ........ *B29C 35/0805* (2013.01); *B29C 39/003* (2013.01); *B29C 39/026* (2013.01);
(Continued)

(58) Field of Classification Search
CPC ............ B23K 2103/56; B23K 26/0006; B23K 26/364; B23K 26/402; B23K 26/55;
(Continued)

(56) References Cited

U.S. PATENT DOCUMENTS

| 2007/0134889 A1* | 6/2007 | Watanabe ......... H01L 21/67092 438/462 |
| 2020/0361188 A1* | 11/2020 | Kuwagata ............... B32B 27/36 |
| 2021/0043469 A1 | 2/2021 | Kakinuma |

FOREIGN PATENT DOCUMENTS

| JP | 2013021017 A | | 1/2013 |
| JP | 2013067053 A | * | 4/2013 |
| JP | 2021034492 A | | 3/2021 |

OTHER PUBLICATIONS

Machine translation JP-2013067053-A, Kaga, Apr. 18, 2013.*
(Continued)

*Primary Examiner* — Philip C Tucker
*Assistant Examiner* — Jimmy R Smith, Jr.
(74) *Attorney, Agent, or Firm* — Greer, Burns & Crain, Ltd

(57) ABSTRACT

There is provided a manufacturing method of a protective-component-provided workpiece. The manufacturing method of a protective-component-provided workpiece includes a step of dissolving a thermoplastic resin whose solubility parameter is equal to or higher than 8.5, in a liquid ultraviolet-curable resin, to prepare a liquid mixed resin, a step of supplying the mixed resin to a support surface of a support table to form a resin layer with a predetermined thickness, a step of irradiating the resin layer with ultraviolet rays and curing the resin layer to form a protective component with a sheet shape, and a step of heating the sheet-shaped protective component before or after one surface of the sheet-shaped protective component and one surface of the workpiece are brought into close contact with each other, and causing the sheet-shaped protective component to come into close contact with the workpiece and integrate with the workpiece.

5 Claims, 11 Drawing Sheets

(51) Int. Cl.
    *B29C 39/02*     (2006.01)
    *B29C 39/38*     (2006.01)
    *B29L 31/34*     (2006.01)

(52) U.S. Cl.
    CPC ...... *B29C 39/38* (2013.01); *B29C 2035/0827* (2013.01); *B29L 2031/34* (2013.01)

(58) Field of Classification Search
    CPC . B26D 1/15; B26D 1/157; B26D 3/06; B26D 7/01; B29C 2035/0827; B29C 35/0805; B29C 39/003; B29C 39/026; B29C 39/38; B29C 41/12; B29C 41/46; B29C 69/00; B29C 2035/0833; B29L 2031/34; H01L 21/67092; H01L 21/67115; H01L 21/67132; H01L 21/6715
    See application file for complete search history.

(56) References Cited

OTHER PUBLICATIONS

Machine translation JP-2021034492-A, Arifuku, Mar. 1, 2021.*
Office Action issued in counterpart German patent application No. 10 2022 204 468.1, dated Feb. 23, 2024.

* cited by examiner

FIG.19

| | MIXING RATIO | SHAPING EVALUATION | SEPARATION EVALUATION |
|---|---|---|---|
| COMPARATIVE EXAMPLE 1 | 2:8 | × | × |
| PRESENT INVENTION PRODUCT OR THE LIKE 1 | 3:7 | ○ | ○ |
| PRESENT INVENTION PRODUCT OR THE LIKE 2 | 6:4 | ○ | ○ |
| PRESENT INVENTION PRODUCT OR THE LIKE 3 | 7:3 | ○ | ○ |
| COMPARATIVE EXAMPLE 2 | 8:2 | ○ | × |

MANUFACTURING METHOD OF PROTECTIVE-COMPONENT-PROVIDED WORKPIECE

BACKGROUND OF THE INVENTION

Field of the Invention

The present invention relates to a manufacturing method of a protective-component-provided workpiece, a processing method of a workpiece, and a protective component for a workpiece.

Description of the Related Art

When various plate-shaped workpieces such as a semiconductor wafer, a resin package substrate, a ceramic substrate, and a glass substrate are ground to be thinned by a grinding apparatus or are divided by a cutting blade or a laser beam, the workpieces are held under suction by a chuck table. In order to prevent damage, contamination, and so forth of the workpiece caused when a surface of the workpiece to be held by the chuck table comes into contact with a holding surface of the chuck table, and to convey all chips (chip-shaped devices) collectively after the workpiece is divided into the plural chips, an adhesive tape as a protective component is usually stuck to the surface of the workpiece to be held (for example, refer to Japanese Patent Laid-open No. 2013-021017).

SUMMARY OF THE INVENTION

In general, the adhesive tape has a layer-stacking structure that includes a base layer made of a resin and a glue layer having an adhesive made of a resin. When the glue layer of the adhesive tape is brought into close contact with the surface of the workpiece to be held and is stuck thereto, there is a problem that a residue of the adhesive is left on the workpiece when the adhesive tape is separated from the workpiece. Further, due to action of the glue layer as a cushion, the workpiece becomes more likely to vibrate in processing. As a result, there is a problem that breakage may possibly occur in the workpiece or chips obtained by dividing the workpiece may possibly be scattered.

Thus, there has been devised a method of forming a workpiece with a protective component by melting a thermoplastic resin supplied onto one surface of a workpiece, to form a layer that becomes the protective component. This allows the absence of the glue layer, and therefore, there is an effect that no residual glue is left. However, a heating time of several tens of seconds to several tens of minutes is required to form the thermoplastic resin into a uniform layer with application of heat and pressure, leading to a decrease in efficiency. Further, there has also been devised a method in which a thermoplastic resin to which heat and pressure are applied in advance is used to form a sheet and thermocompression bonding is executed to bond the formed sheet to a workpiece. However, even in the case of forming the sheet by the thermoplastic resin through application of heat and pressure, the sheet shrinks in cooling, and the thickness and size of the sheet change. This leaves problems that it is difficult to form the sheet into a uniform size without variation and that the workpiece bends due to the shrinkage of the sheet.

Thus, an object of the present invention is to provide a manufacturing method of a protective-component-provided workpiece, a processing method of a workpiece, and a protective component for a workpiece that can reduce shrinkage of a sheet due to cooling and reduce variation in the thickness and size of the sheet.

In accordance with an aspect of the present invention, there is provided a manufacturing method of a protective-component-provided workpiece in which a protective component that protects a plate-shaped workpiece is brought into close contact with one surface of the workpiece to manufacture the protective-component-provided workpiece. The manufacturing method of a protective-component-provided workpiece includes a mixed resin preparation step of dissolving a thermoplastic resin whose solubility parameter is equal to or higher than 8.5, in a liquid ultraviolet-curable resin, to prepare a liquid mixed resin, a resin layer forming step of supplying the mixed resin to a support surface of a support table to form a resin layer with a predetermined thickness, a protective component forming step of irradiating the resin layer with ultraviolet rays and curing the resin layer to form the protective component with a sheet shape, and a protective-component-provided workpiece forming step of heating the sheet-shaped protective component before or after one surface of the sheet-shaped protective component and the one surface of the workpiece are brought into close contact with each other, and causing the sheet-shaped protective component to come into close contact with the workpiece and integrate with the workpiece.

Preferably, the manufacturing method of a protective-component-provided workpiece further includes a protective component cooling step of cooling the protective component after the protective-component-provided workpiece forming step.

Further, preferably, devices are formed on the one surface of the workpiece.

In accordance with another aspect of the present invention, there is provided a processing method of a workpiece for processing the workpiece with a plate shape. The processing method of a workpiece includes a processing step of holding, by a chuck table, a sheet-shaped protective component of a protective-component-provided workpiece in which one surface of the protective component and one surface of the workpiece are in close contact with each other, the protective component being formed by applying ultraviolet rays to and curing a mixed resin obtained by mixing a thermoplastic resin whose solubility parameter is equal to or higher than 8.5 with a liquid ultraviolet-curable resin, and processing the workpiece, and a protective component separation step of separating the protective component from the workpiece after the processing step is executed.

Preferably, the processing method of a workpiece further includes a mixed resin preparation step of, before the processing step, dissolving the thermoplastic resin whose solubility parameter is equal to or higher than 8.5, in the liquid ultraviolet-curable resin, to prepare the mixed resin in a liquid state, a resin layer forming step of, after the mixed resin preparation step but before the processing step, supplying the mixed resin to a support surface of a support table to form a resin layer with a predetermined thickness, a protective component forming step of, after the resin layer forming step but before the processing step, irradiating the resin layer with ultraviolet rays and curing the resin layer to form the sheet-shaped protective component, and a protective-component-provided workpiece forming step of, after the protective component forming step but before the processing step, bringing the one surface of the sheet-shaped protective component being heated and the one surface of the workpiece into close contact with each other to form the protective-component-provided workpiece.

In accordance with a further aspect of the present invention, there is provided a protective component for a workpiece that is into close contact with one surface of the workpiece having a circular disc shape and protects the workpiece. The protective component is formed into a sheet shape by applying ultraviolet rays to and curing a mixed resin obtained by mixing a thermoplastic resin whose solubility parameter is equal to or higher than 8.5 with a liquid ultraviolet-curable resin.

According to the invention of the present application, shrinkage of the sheet due to cooling can be reduced, and variation in the thickness and size of the sheet can be reduced.

The above and other objects, features and advantages of the present invention and the manner of realizing them will become more apparent, and the invention itself will best be understood from a study of the following description and appended claims with reference to the attached drawings showing preferred embodiments of the invention.

BRIEF DESCRIPTION OF THE DRAWINGS

FIG. 19 is a diagram for explaining the action and effects of the manufacturing method of a protective-component-provided workpiece, the processing method of a workpiece, and the protective component for a workpiece according to the first embodiment.

DETAILED DESCRIPTION OF THE PREFERRED EMBODIMENTS

Embodiments of the present invention will be described in detail below with reference to the drawings. The present invention is not limited by the details of the following embodiments. Further, constituent elements described below include what can easily be envisaged by those skilled in the art and what are substantially the same as them described herein. Moreover, the configurations described below can be combined as appropriate. In addition, various kinds of omission, replacement, or change of a configuration can be carried out without departing from the gist of the present invention.

First Embodiment

Figure 1:
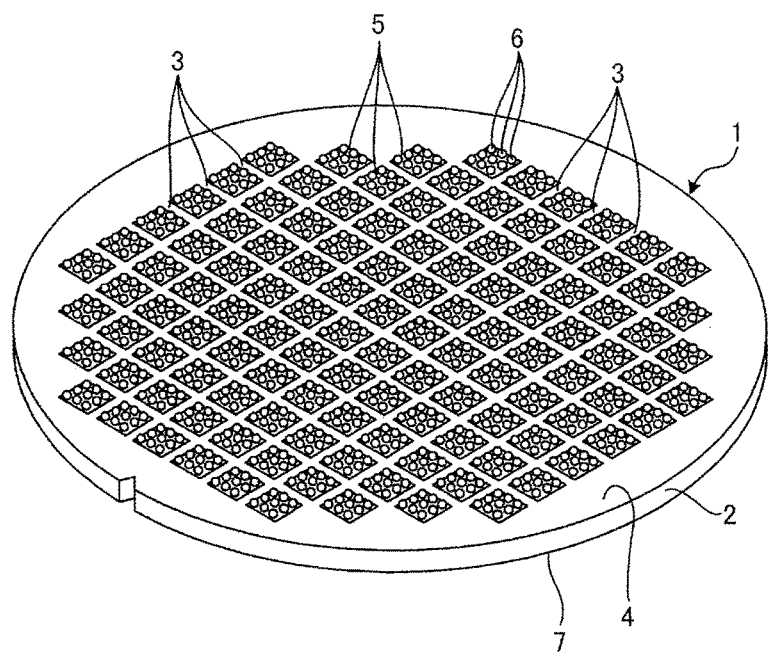
FIG. 1 is a perspective view illustrating a workpiece that is a subject of a manufacturing method of a protective-component-provided workpiece, a processing method of a workpiece, and a protective component for a workpiece according to a first embodiment.

A manufacturing method of a protective-component-provided workpiece, a processing method of a workpiece, and a protective component for a workpiece according to a first embodiment of the present invention will be described based on drawings. FIG. 1 is a perspective view illustrating a workpiece 1 that is a subject of the manufacturing method of a protective-component-provided workpiece, the processing method of a workpiece, and the protective component for a workpiece according to the first embodiment. In the first embodiment, the workpiece 1 is a wafer such as a circular plate-shaped semiconductor wafer or optical device wafer and includes, as a substrate 2, silicon, sapphire, gallium arsenide, an SiC substrate, a GaN substrate, a lithium tantalate (LT) substrate, a single-crystal diamond substrate, or the like. Note that the workpiece 1 is not limited to the circular plate-shaped workpiece in the present invention and may be a resin package substrate, a metal substrate, or another plate-shaped object.

In the first embodiment, as illustrated in FIG. 1, the workpiece 1 has a front surface 4 segmented by plural planned dividing lines 3 that intersect (in the first embodiment, are orthogonal), and chip-shaped devices 5 are formed in the respective regions of the front surface 4. The workpiece 1 is divided along the respective planned dividing lines 3 into the individual devices 5 (chips). Note that the workpiece 1 is not limited to that described above in the present invention, and the devices 5 do not have to be formed thereon. In the workpiece 1, in the first embodiment, plural bumps 6 of electrodes are mounted on a region of the front surface 4 that correspond to the device 5, and protrude from the front surface 4. As the bumps 6 are mounted on the front surface 4, the workpiece 1 and the devices 5 have an uneven structure. Note that the workpiece 1 and the devices 5 do not need to have the bumps 6 and the uneven structure on the front surface 4 in the present invention. In the first embodiment, the workpiece 1 has a back surface 7 that is opposite to the front surface 4, and the back surface 7 is flatly formed. However, the present invention is not limited to this configuration, and an uneven structure may be formed on the back surface 7.

Figure 2:
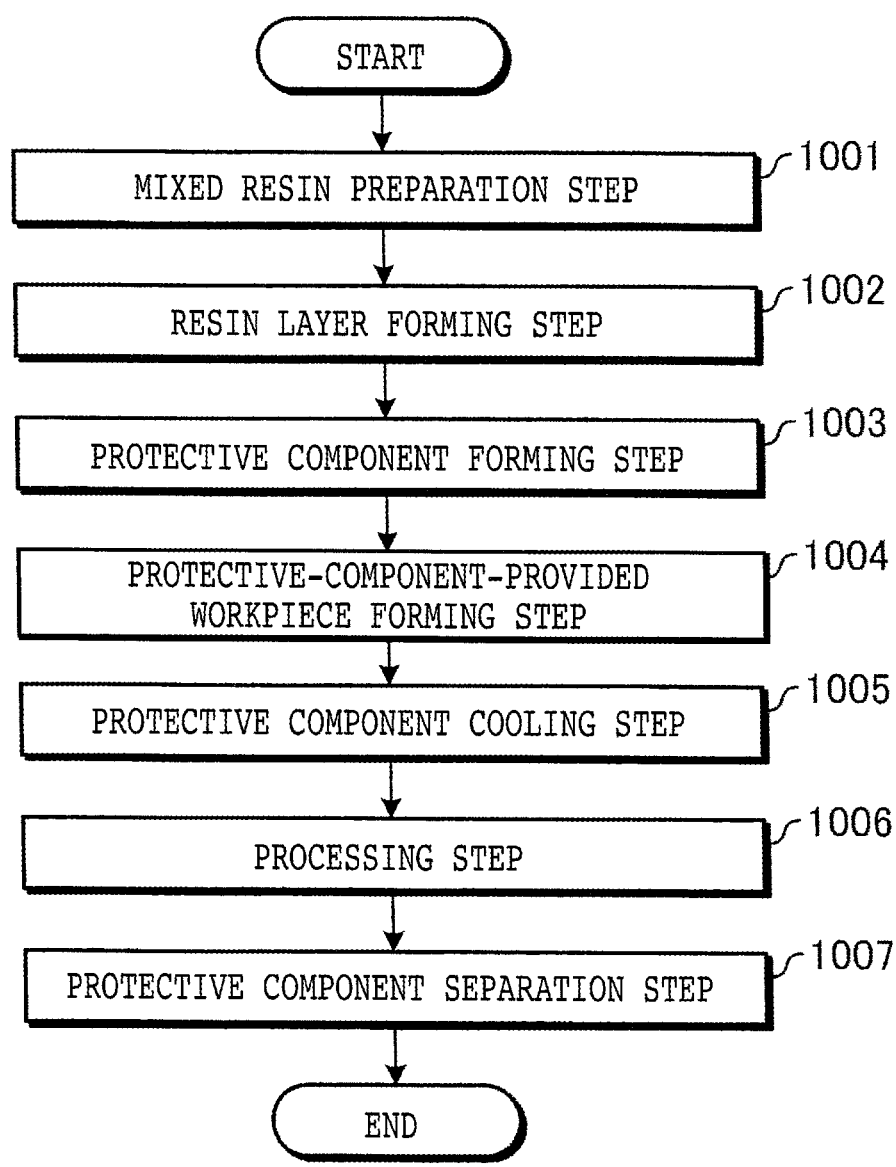
FIG. 2 is a flowchart illustrating a processing procedure of the manufacturing method of a protective-component-provided workpiece and the processing method of a workpiece according to the first embodiment.

FIG. 2 is a flowchart illustrating a processing procedure of the manufacturing method of a protective-component-provided workpiece and the processing method of a workpiece according to the first embodiment. As illustrated in FIG. 2, the manufacturing method of a protective-component-provided workpiece according to the first embodiment includes a mixed resin preparation step 1001, a resin layer forming step 1002, a protective component forming step 1003, a protective-component-provided workpiece forming step 1004, and a protective component cooling step 1005. The processing method of a workpiece according to the first embodiment includes a processing step 1006 and a protective component separation step 1007. In the processing step 1006, a protective-component-provided workpiece 120 (see FIG. 11) that is formed through the respective steps (steps 1001 to 1005) included in the manufacturing method of a protective-component-provided workpiece according to the first embodiment is processed.

In the manufacturing method of a protective-component-provided workpiece according to the first embodiment, the protective-component-provided workpiece 120 is manufactured by using the front surface 4, which is one surface of the workpiece 1, as a surface to be held and bringing a sheet-shaped protective component 110 (see FIG. 6 and so forth) into close contact with the front surface 4 to integrate the protective component 110 with the workpiece 1. However, the present invention is not limited to this configuration. The back surface 7 of the workpiece 1 may be used as the surface to be held, and the protective component 110 may be brought into close contact with the back surface 7 to integrate the protective component 110 with the workpiece 1. Note that the surface to be held is a surface on which the workpiece 1 and the devices 5 are held under suction by a chuck table 145, 155, or 165 (see FIG. 12, FIG. 13, and FIG. 14) in the processing method of a workpiece according to the first embodiment.

Figure 3:
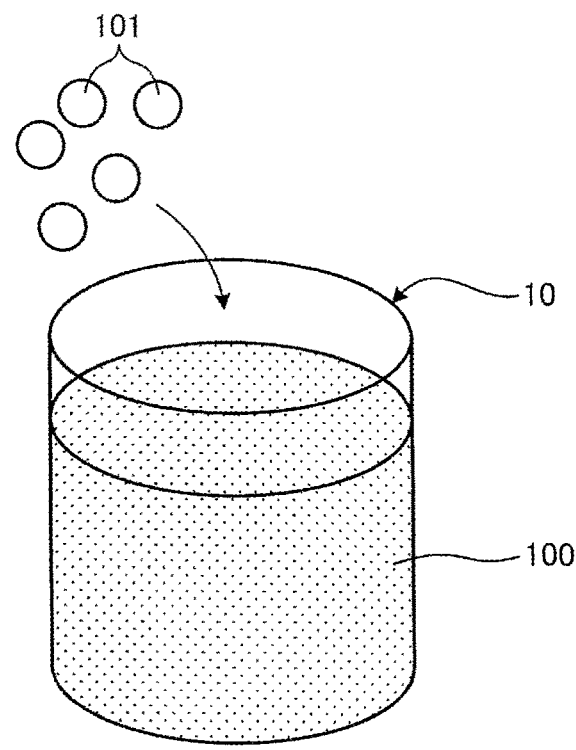
FIG. 3 is a perspective view for explaining a mixed resin preparation step in FIG. 2.
Figure 4:
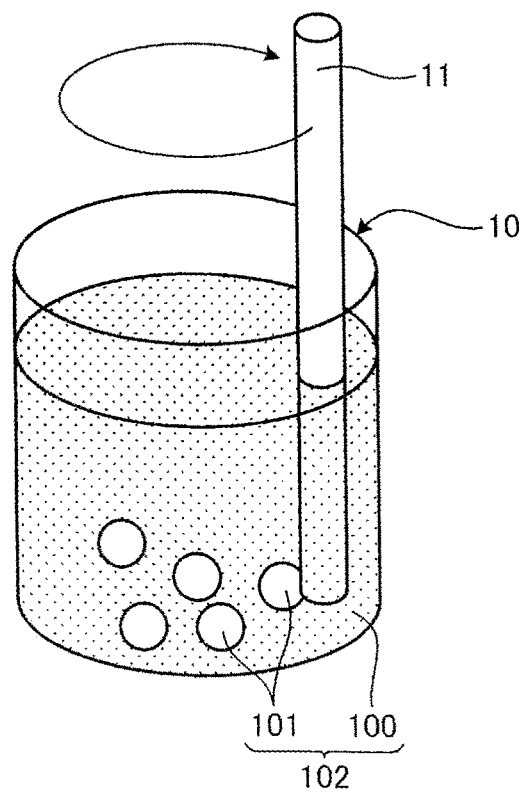
FIG. 4 is a perspective view for explaining the mixed resin preparation step in FIG. 2.

FIG. 3 and FIG. 4 are perspective views for explaining the mixed resin preparation step 1001 in FIG. 2. As illustrated in FIG. 3 and FIG. 4, the mixed resin preparation step 1001 is a step of dissolving a thermoplastic resin 101 whose solubility parameter is equal to or higher than 8.5, in a liquid ultraviolet-curable resin 100 to prepare a liquid mixed resin 102. In the mixed resin preparation step 1001, as illustrated in FIG. 3, the thermoplastic resin 101 whose solubility parameter is equal to or higher than 8.5 is supplied and added to a container 10 in which the liquid ultraviolet-curable resin 100 is put. Then, as illustrated in FIG. 4, the inside of the container 10 is stirred with a stirring bar 11. Thus, the liquid mixed resin 102 in which the ultraviolet-curable resin 100 and the thermoplastic resin 101 are homogeneously mixed is obtained. Here, the state in which the ultraviolet-curable resin 100 and the thermoplastic resin 101 are homogeneously mixed refers to the state in which the ultraviolet-curable resin 100 and the thermoplastic resin 101 are not isolated from each other but dissolved in each other and in which the ultraviolet-curable resin 100 and the thermoplastic resin 101 are both homogeneously distributed in the whole. In the mixed resin preparation step 1001, it is preferable to dissolve the thermoplastic resin 101 in the liquid ultraviolet-curable resin 100 in such a manner that the mass ratio of the liquid ultraviolet-curable resin 100 to the thermoplastic resin 101 at the time when the liquid mixed resin 102 is obtained becomes 3:7 to 7:3. That is, in the mixed resin preparation step 1001, it is preferable to dissolve the thermoplastic resin 101 with the mass that is at least 3/7 and at most 7/3 of the mass of the liquid ultraviolet-curable resin 100, in the liquid ultraviolet-curable resin 100 to obtain the liquid mixed resin 102.

The thermoplastic resin 101 supplied in the mixed resin preparation step 1001 has a particle shape in the first embodiment. However, the shape of the thermoplastic resin 101 is not limited thereto in the present invention and may be any shape as long as it is a solid. For example, the thermoplastic resin 101 supplied in the mixed resin preparation step 1001 may have, besides the above-described particle shape, a granular shape, a fiber shape, a sheet shape, a powder shape, a lump shape, a plate shape, a string shape, a film shape, or the like, and may have a shape that allows the thermoplastic resin 101 to be easily dissolved in the liquid ultraviolet-curable resin 100. Further, the thermoplastic resin 101 that is a solid at room temperature may be heated to such an extent as to exhibit fluidity at the time of supply.

In the first embodiment, as the ultraviolet-curable resin 100, specifically, acrylic-based resins such as an ethylene unsaturated monomer and an ethylene unsaturated oligomer, or epoxy-based resins such as an alicyclic epoxy group-containing monomer, an alicyclic epoxy group-containing oligomer, a glycidyl group-containing monomer, and a glycidyl group-containing oligomer can be used, for example. The ultraviolet-curable resin 100 may be mixed with another ultraviolet-curable resin compound, an additive, or the like as appropriate so as to become a liquid. As the ultraviolet-curable resin 100, a substance whose solubility parameter is equal to or lower than 12 can be used.

The thermoplastic resin 101 is easily mixed with the ultraviolet-curable resin 100 and is favorably dissolved because the solubility parameter thereof is equal to or higher than 8.5. In the first embodiment, specifically, as the thermoplastic resin 101, a substance composed mainly of a methacrylic acid polymer, an acrylic acid polymer, polystyrene, a vinyl acetate resin, a vinyl chloride resin, acetylcellulose, an epoxy resin, a vinylidene chloride resin, a nylon resin, or the like can be used. Here, in a case in which the thermoplastic resin 101 is composed mainly of a methacrylic acid polymer, an acrylic acid polymer, or the like, the ratio of the mass of the methacrylic acid polymer, the acrylic acid polymer, or the like to the mass obtained by removing fillers including nanofillers to be described later and other various compounding agents from the whole of the thermoplastic resin 101 is at least 1 mass %, and is preferably equal to or higher than 5 mass %, and is more preferably equal to or higher than 10 mass %. The thermoplastic resin 101 may be mixed with another thermoplastic resin compound, an additive, or the like as appropriate in order for the solubility parameter to become equal to or higher than 8.5. The thermoplastic resin whose solubility parameter is lower than 8.5 is mixed with the ultraviolet-curable resin 100 less readily, and it is difficult to obtain the liquid mixed resin 102 in which these resins are homogenously mixed. Further, the difference in the solubility parameter between the thermoplastic resin 101 and the ultraviolet-curable resin 100 is set equal to or smaller than 3, more preferably equal to or smaller than 1.

As another thermoplastic resin compound mixed in the thermoplastic resin 101 as appropriate, specifically, one kind or two or more kinds of substances selected from the following substances can be cited: an acrylic resin, a methacrylic resin, a vinyl-based resin, polyacetal, natural rubber, butyl rubber, isoprene rubber, chloroprene rubber, a polyolefin such as polyethylene, polypropylene, poly(4-methyl-1-pentene), and poly(1-butene), polyester such as polyethylene terephthalate and polybutylene terephthalate, a polyamide such as Nylon 6, Nylon 66, and poly(meta-xylene adipamide), polyacrylate, polymethacrylate, polyvinyl chloride, polyetherimide, polyacrylonitrile, polycarbonate, polystyrene, polysulfone, polyethersulfone, polyphenylene, an ether polybutadiene resin, a polycarbonate resin, a thermoplastic polyimide resin, a thermoplastic polyurethane resin, a phenoxy resin, a polyamideimide resin, a fluorine resin, an ethylene-unsaturated carboxylic acid copolymer resin, an ethylene-vinyl acetate copolymer resin, an ionomer, an ethylene-vinyl acetate-maleic anhydride ternary copolymer resin, an ethylene-vinyl acetate copolymer saponified resin, an ethylene-vinyl alcohol copolymer resin, and so forth.

As the unsaturated carboxylic acid that configures the above-described ethylene-unsaturated carboxylic acid copolymer used as another thermoplastic resin compound mixed in the thermoplastic resin 101 as appropriate, maleic acid, Itaconic acid, monomethyl maleate, monoethyl maleate, maleic anhydride, Itaconic anhydride, and so forth are cited as examples. Here, the ethylene-unsaturated carboxylic acid copolymer includes not only a binary copolymer of ethylene and unsaturated carboxylic acid but also a multi-component copolymer with which further another monomer is copolymerized. As the above-described other monomer that may be copolymerized with the ethylene-unsaturated carboxylic acid copolymer, vinyl esters such as vinyl acetate and vinyl propionate, unsaturated carboxylate esters such as dimethyl maleate and diethyl maleate, and so forth are cited as examples.

In the first embodiment, the softening point of the thermoplastic resin 101 is a temperature in a range of 0° C. to 300° C. Because the compound group cited as examples above is used for the thermoplastic resin 101, the softening point becomes a temperature in range of 0° C. to 300° C. For the thermoplastic resin 101, the softening point can be adjusted by mixing different kinds of compounds cited as examples above. For example, by adjusting the softening point to a temperature higher than approximately 40° C. to 100° C., which is the temperature of the workpiece 1 in dry polishing processing, the thermoplastic resin 101 can be prevented from becoming the softened state in the dry polishing processing.

In the first embodiment, in the cured state at a lower temperature than the softening point, the thermoplastic resin 101 is a rigid body that does not have fluidity, and does not have adhesiveness like that of an adhesive substantially. Therefore, excessive adhesion to the front surface 4 of the workpiece 1 is suppressed. Further, in the thermoplastic resin 101, adhesiveness like that of an adhesive is not exhibited substantially even in the softened state at a higher temperature than the softening point. Therefore, excessive adhesion to the front surface 4 of the workpiece 1 is reduced.

The thermoplastic resin 101 contains neither sodium nor zinc, which are metals that possibly cause operation failure of the device 5 through coming into contact with the workpiece 1 and entering the device 5. Note that, generally, sodium and zinc are intentionally added in order to cause the base layer of an adhesive tape to have toughness (that is, flexibility and sturdiness) and are not contained basically if they are not intentionally added. Here, it is assumed that, if the thermoplastic resin 101 contains neither sodium nor zinc, the amounts of both of sodium and zinc are smaller than the detection limit even when the thermoplastic resin 101 is analyzed by using a component detection method that can be executed for the thermoplastic resin 101 and that is well-known at the timing of the present application, such as inductively coupled plasma mass spectrometry (ICP-MS), secondary ion mass spectrometry (SIMS), or the like.

The mixed resin 102 is mixed with fillers whose size is at least 0.1 nm and at most 400 nm. The fillers have a particle shape in the first embodiment. However, the fillers are not limited thereto in the present invention and may have a shape such as a columnar shape like fiber. Note that, in the present specification, the size of the fillers is defined based on the particle diameter of the fillers. As the way of representing the particle diameter, there are known ways such as the geometric diameter and the equivalent diameter. As the geometric diameter, there are the Feret diameter, the unidirectional maximum diameter (i.e. Krummbein diameter), the Martin diameter, the sieve diameter, and so forth. As the equivalent diameter, there are the projected area diameter (i.e. Heywood diameter), the equivalent surface diameter, the equivalent volume diameter, the Stokes diameter, the light scattering diameter, and so forth. Even when the fillers have a shape such as a columnar shape like fiber, the size of the fillers can be defined by a method similar to that of the above-described case in which the fillers have a particle shape. Further, in the present specification, the fillers whose size is at least 0.1 nm and at most 400 nm are deemed as fillers with a size on the order of nanometers and are referred to as nanofillers as appropriate.

The mixed resin 102 that is mixed with such nanofillers becomes close to transparent because the size of the mixed nanofillers is smaller than the wavelength of visible light and the mixed resin 102 cannot absorb or scatter the visible light. Thus, observing the workpiece 1 through the protective component 110 is not precluded, and therefore, alignment in which the devices 5 are observed through the protective component 110 can be executed easily. Note that the protective component formed by using the thermoplastic resin mixed with fillers larger than 400 nm involves a possibility that the ratio of absorption or scattering of visible light by the mixed fillers becomes high and that the transparency lowers.

It is preferable that the fillers are contained in the mixed resin 102 in such a manner that the mixing ratio of the nanofillers to all fillers exceeds 50 wt % (mass %). For example, when fillers with a size of 500 nm among all fillers are mixed at ratios of 40 wt %, 50 wt %, and 60 wt %, the visibility of the devices 5 observed through the protective component 110 obtained by shaping this mixed resin 102 is favorable in the case of 40 wt %. However, in the cases of 50 wt % and 60 wt %, although the devices 5 can visually be recognized through the protective component 110 obtained by shaping this mixed resin 102, the visibility thereof decreases compared with the case of 40 wt %.

The nanofillers mixed in the mixed resin 102 are a filling agent with a smaller thermal expansion coefficient than that of the mixed resin 102, and an inorganic filling agent or an organic filling agent with a smaller thermal expansion coefficient than that of the mixed resin 102 is preferably used. The mixed resin 102 that is mixed with such nanofillers can reduce shrinkage of the protective component 110 when the protective component 110 is brought into close contact with the workpiece 1 and is then cooled. In association with this, bending and deformation of the workpiece 1 with which the protective component 110 is brought into close contact can be reduced.

It is preferable that the nanofillers mixed in the mixed resin 102 are an inorganic filling agent. Specifically, fused silica, crystalline silica, alumina, calcium carbonate, calcium silicate, barium sulfate, talc, clay, magnesium oxide, aluminum oxide, beryllium oxide, iron oxide, titanium oxide, aluminum nitride, silicon nitride, boron nitride, mica, glass, quartz, or the like is preferably used. Further, two or more kinds of substances in the above-described substances may be mixed and used as the nanofillers mixed in the mixed resin 102. It is preferable that silicas such as fused silica and crystalline silica among the above-described inorganic filling agents are used as the nanofillers mixed in the mixed resin 102. In this case, the cost of the nanofillers can favorably be suppressed.

The content rate (mixing ratio) of the nanofillers in the mixed resin 102 can be changed in a range of 0.01 to 90 wt %. When the content rate of the nanofillers is higher, the thermal expansion coefficient of the protective component 110 becomes smaller, and the dressing effect also becomes higher. However, there is a possibility that the whole of the protective component 110 becomes fragile when the content rate is too high. Therefore, the protective component 110 is formed with an appropriate rate selected.

An initiator is added to the mixed resin 102 to initiate curing of the ultraviolet-curable resin 100. Further, in addition to the initiator, various compounding agents such as an antioxidant, a light stabilizer, a binder resin, an antistatic agent, a silane coupling agent, a release agent, a surfactant, a dye, a pigment, a fluorescent agent, and an ultraviolet absorber can be added as need.

Figure 5:
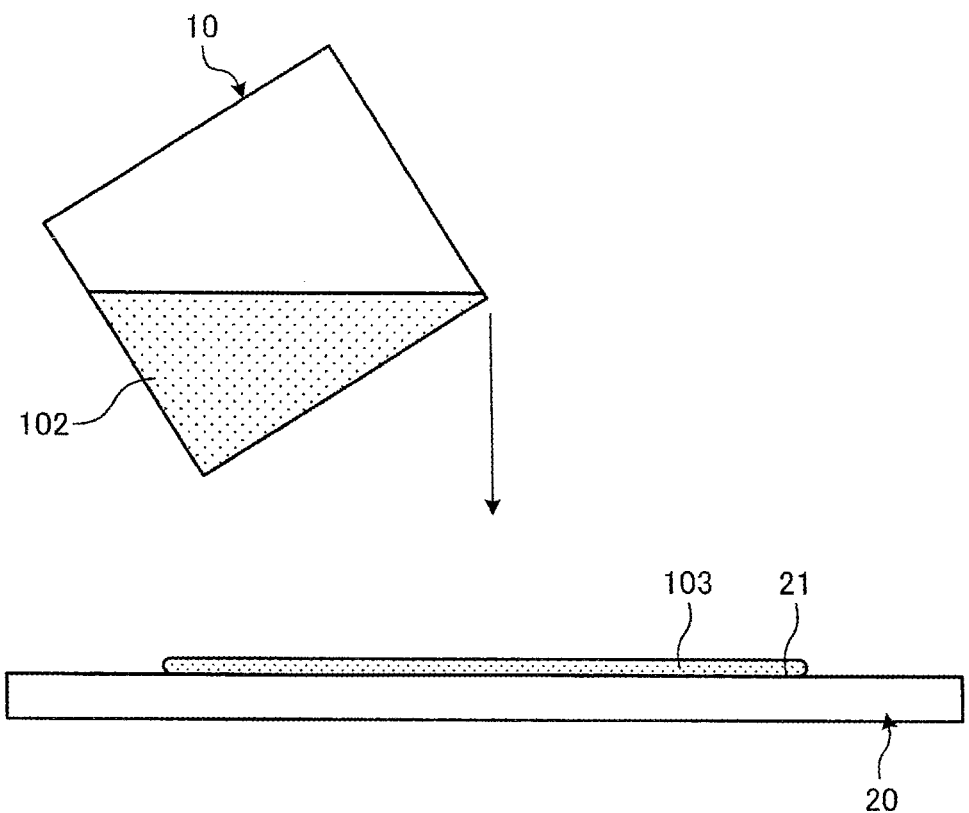
FIG. 5 is a sectional view for explaining a resin layer forming step in FIG. 2.

FIG. 5 is a sectional view for explaining the resin layer forming step 1002 in FIG. 2. The resin layer forming step 1002 is a step of supplying the mixed resin 102 to a support surface 21 of a support table 20 to form a resin layer 103 with a predetermined thickness, as illustrated in FIG. 5. In the resin layer forming step 1002, as illustrated in FIG. 5, when the mixed resin 102 is supplied to the support surface 21 of the support table 20, the mixed resin 102 spreads over the support surface 21 due to its own weight because the mixed resin 102 is in the liquid state, or through being pressed by a flat surface or the like. This forms the resin layer 103 with the predetermined thickness on the support surface 21. In the resin layer forming step 1002, because the liquid mixed resin 102 obtained by dissolving the thermoplastic resin 101 in the liquid ultraviolet-curable resin 100 is supplied onto the support surface 21, the mixed resin 102 can be formed into the resin layer 103 with the predetermined thickness in a short time without the need to apply heat and pressure particularly.

In the resin layer 103 formed in the resin layer forming step 1002, the ultraviolet-curable resin 100 and the thermoplastic resin 101 are homogeneously mixed. Further, the resin layer 103 formed in the resin layer forming step 1002 has such a volume as to cover the bumps 6 in the whole of the front surface 4 of the workpiece 1. That is, the resin layer 103 has such a volume that the sheet-shaped protective component 110 formed in the later protective component forming step 1003 can seamlessly cover the front surface 4 in the later protective-component-provided workpiece forming step 1004 and can be formed to be thicker than recesses and protrusions on the front surface 4 formed by the bumps 6. It is preferable for the resin layer 103 to have such a volume as not to protrude from the outer edge of the front surface 4 of the workpiece 1 when being shaped into the predetermined thickness. The predetermined thickness of the resin layer 103 can be changed by changing the viscosity of the mixed resin 102 or changing the volume of the mixed resin 102 supplied in the resin layer forming step 1002, for example.

Figure 6:
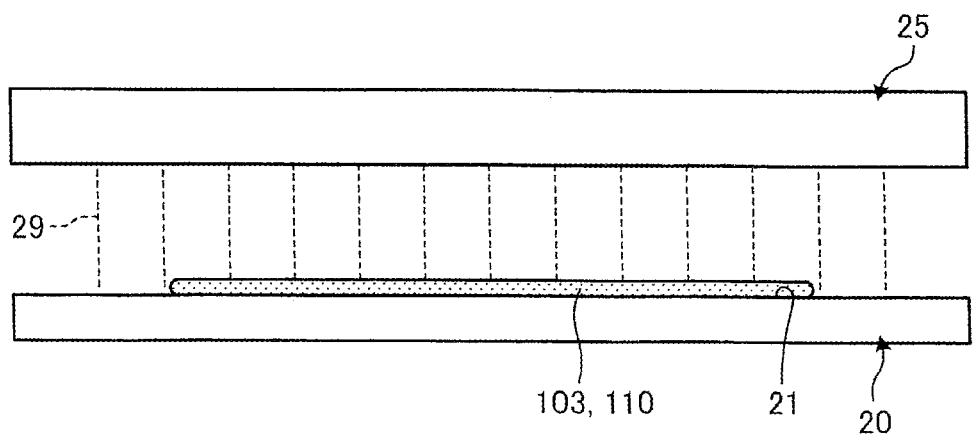
FIG. 6 is a sectional view for explaining a protective component forming step in FIG. 2.

FIG. 6 is a sectional view for explaining the protective component forming step 1003 in FIG. 2. The protective component forming step 1003 is a step of irradiating the resin layer 103 with ultraviolet rays 29 and curing the resin layer 103 to form the sheet-shaped protective component 110, as illustrated in FIG. 6. In the protective component forming step 1003, as illustrated in FIG. 6, an ultraviolet irradiator 25 is brought close over the resin layer 103 formed on the support surface 21 of the support table 20, and the whole surface of the resin layer 103 is irradiated with the ultraviolet rays 29 by the ultraviolet irradiator 25. Thus, the ultraviolet-curable resin 100 homogeneously distributed in the mixed resin 102 that forms the resin layer 103 is subjected to ultraviolet curing reaction, and the mixed resin 102 is cured to form the sheet-shaped protective component 110. In the sheet-shaped protective component 110 formed in this manner, the ultraviolet-curable resin 100 and the thermoplastic resin 101 are homogeneously mixed. Further, in the sheet-shaped protective component 110 formed in this manner, because the resin layer 103 is cured with the ultraviolet-curable resin 100 homogeneously distributed, the shape and the size (for example, predetermined thickness) are maintained in the whole of the resin layer 103. In addition, because the sheet-shaped protective component 110 includes the thermoplastic resin 101 homogeneously distributed, the sheet-shaped protective component 110 can be brought into close contact with and integrated with the front surface 4 of the workpiece 1 with a substantially uniform adhesive force by being heated and softened in the whole of surfaces 113 and 114 (see FIG. 7 and so forth) of the sheet-shaped protective component 110.

In such a manner as described above, the sheet-shaped protective component 110 is formed without heating the thermoplastic resin 101 to soften or melt it. Therefore, softening and expansion due to heating and shrinkage due to cooling do not occur, and the protective component 110 can be formed into a desired size (thickness and area) with suppression of the occurrence of variation in the thickness, warpage, and so forth. Further, the resin layer 103 may be irradiated with the ultraviolet rays 29 through the support table 20 that supports the resin layer 103.

Figure 7:
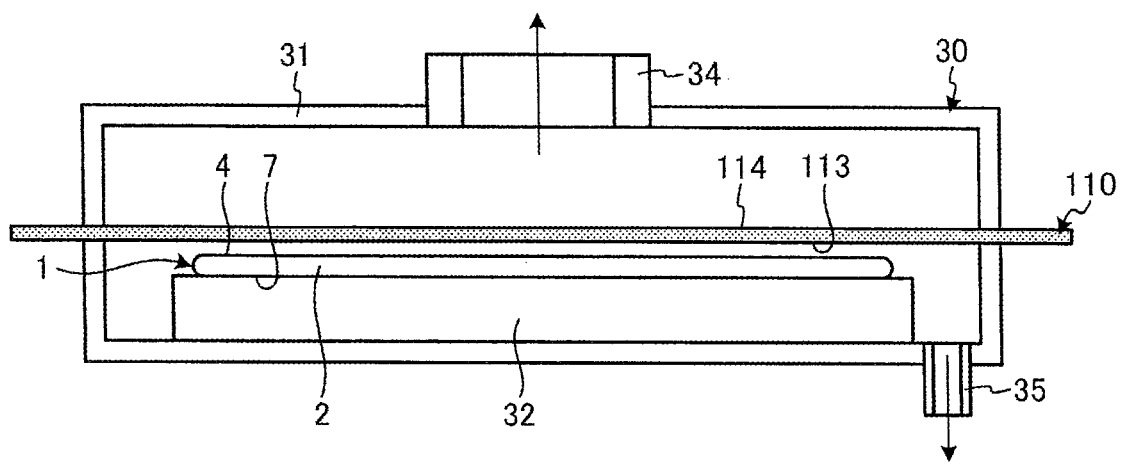
FIG. 7 is a sectional view for explaining a protective-component-provided workpiece forming step in FIG. 2.
Figure 8:
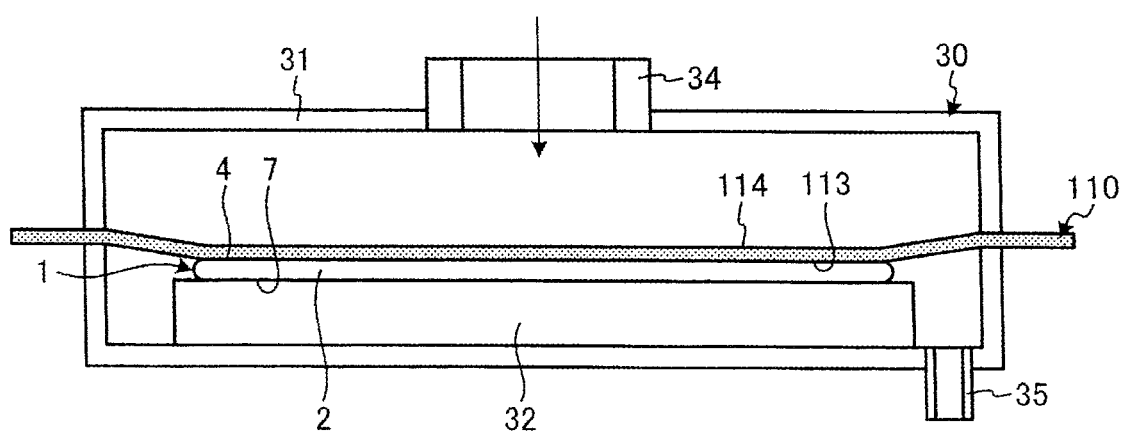
FIG. 8 is a sectional view for explaining the protective-component-provided workpiece forming step in FIG. 2.
Figure 9:
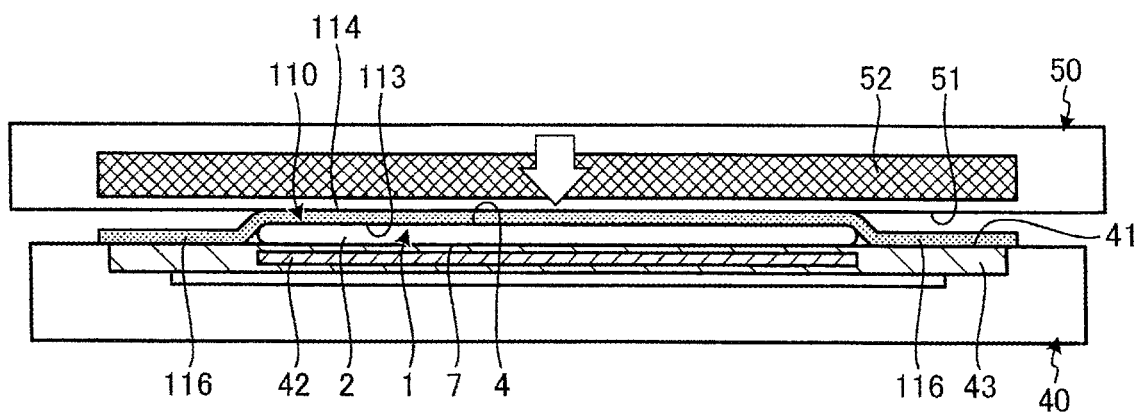
FIG. 9 is a sectional view for explaining the protective-component-provided workpiece forming step in FIG. 2.

FIG. 7, FIG. 8, and FIG. 9 are sectional views for explaining the protective-component-provided workpiece forming step 1004 in FIG. 2. Note that, in FIG. 7 to FIG. 9, diagrammatic representation of the bumps 6 is omitted. The protective-component-provided workpiece forming step 1004 is a step of heating the sheet-shaped protective component 110 formed in the protective component forming step 1003, before or after one surface of the sheet-shaped protective component 110 and one surface of the workpiece 1 are brought into close contact with each other, and causing the sheet-shaped protective component 110 to come into close contact with the workpiece 1 and integrate with the workpiece 1. In the protective-component-provided workpiece forming step 1004, in the first embodiment, as illustrated in FIG. 7, FIG. 8, and FIG. 9, the sheet-shaped protective component 110 is heated after the one surface of the sheet-shaped protective component 110 and the one surface of the workpiece 1 are brought into close contact with each other. However, the present invention is not limited to this configuration, and the sheet-shaped protective component 110 may be heated before the one surface of the sheet-shaped protective component 110 and the one surface of the workpiece 1 are brought into close contact with each other.

In the protective-component-provided workpiece forming step 1004, first, as illustrated in FIG. 7, the workpiece 1 is placed on a support base 32 with the front surface 4 oriented upward. The support base 32 is set in a central region on the lower side in a vacuum chamber 31 of a sheet close-contact apparatus 30. The support base 32 has a heat source and heats the placed workpiece 1 to heat and soften the sheet-shaped protective component 110 in close contact with the workpiece 1. In the protective-component-provided workpiece forming step 1004, next, the surface 113 of the sheet-shaped protective component 110 is oriented downward, and the end of the sheet-shaped protective component 110 is clamped and fixed between an upper lid and a main body part that vertically divide a casing that forms the vacuum chamber 31. In this manner, in the protective-component-provided workpiece forming step 1004, the surface 113 of the sheet-shaped protective component 110 is oriented toward the front surface 4 of the workpiece 1 on the support base 32 and is disposed to cover the upper side of the front surface 4.

In the protective-component-provided workpiece forming step 1004, after the sheet-shaped protective component 110 is disposed over the workpiece 1, the atmospheric air in the vacuum chamber 31 is evacuated to reduce the pressure from a first communication path 34 made in a central region on the upper side of the vacuum chamber 31 and a second communication path 35 made outside the support base 32 on the lower side of the vacuum chamber 31, as illustrated in FIG. 7. In the protective-component-provided workpiece forming step 1004, this pressure reduction treatment reduces and prevents capturing of air between the front surface 4 of the workpiece 1 and the surface 113 of the protective component 110. In the protective-component-provided workpiece forming step 1004, in the first embodiment, the pressure in the vacuum chamber 31 is reduced to approximately $10^5$ to $10^1$ Pa in absolute pressure by a dry pump, an oil rotary pump, or the like disposed to communicate with the first communication path 34 and the second communication path 35, for example.

In the protective-component-provided workpiece forming step 1004, after the air in the vacuum chamber 31 is evacuated and the pressure is reduced from the first communication path 34 and the second communication path 35, as illustrated in FIG. 8, a gas is introduced from the first communication path 34 into the vacuum chamber 31 in the state in which the air pressure of the main body part of the vacuum chamber 31 is maintained. In the protective-component-provided workpiece forming step 1004, by setting the air pressure of the upper side of the sheet-shaped protective component 110 higher than the air pressure of the lower side of the sheet-shaped protective component 110 as above, the surface 113 of the sheet-shaped protective component 110 is brought into close contact with the front surface 4 of the workpiece 1 placed under the sheet-shaped protective component 110, as illustrated in FIG. 8.

Note that, in the protective-component-provided workpiece forming step 1004, the position of the sheet-shaped protective component 110 and the position of the workpiece 1 in the vertical direction may be switched, and the front surface 4 of the workpiece 1 may be brought into close contact with the surface 113 of the sheet-shaped protective component 110 placed under the workpiece 1, through pressing the workpiece 1 from above.

Further, in the protective-component-provided workpiece forming step 1004, the support base 32 that supports the workpiece 1 may be raised to bring the front surface 4 of the workpiece 1 into close contact with the surface 113 of the sheet-shaped protective component 110 placed over the workpiece 1. In this case, it is preferable that the side of the surface 114 of the sheet-shaped protective component 110 is held down from above by a support surface of a predetermined support component. Moreover, heat sources similar to heat sources 42 and 52 to be described later may be disposed inside the support base 32 that supports the workpiece 1 and inside the support component that supports the side of the surface 114 of the sheet-shaped protective component 110.

In the protective-component-provided workpiece forming step 1004, after the surface 113 of the sheet-shaped protective component 110 is brought into close contact with the front surface 4 of the workpiece 1, the sheet-shaped protective component 110 and the workpiece 1 are taken out from the inside of the vacuum chamber 31 of the sheet close-contact apparatus 30. Then, as illustrated in FIG. 9, the back surface 7, which is the other surface of the workpiece 1, is oriented toward a holding surface 41 of a suction holding table 40, and the workpiece 1 is placed and held under suction on the suction holding table 40. Here, the suction holding table 40 includes a holding part 43 in which the holding surface 41 is disposed and that is formed of a porous ceramic or the like. The holding part 43 is connected to a vacuum suction source that is not illustrated in the diagram, and holds the workpiece 1 under suction by the holding surface 41 by being sucked by the vacuum suction source.

In the protective-component-provided workpiece forming step 1004, then, the sheet-shaped protective component 110 is heated and softened from the side of the holding surface 41 through the workpiece 1 by the heat source 42 disposed inside the suction holding table 40. Further, in the protective-component-provided workpiece forming step 1004, as illustrated in FIG. 9, a flat pressing surface 51 of a pressing component 50 is brought close to and into contact with the surface 114 of the sheet-shaped protective component 110 that is in close contact with the front surface 4 of the workpiece 1 held under suction by the suction holding table 40, from the side opposite to the side of the holding surface 41. Moreover, in the protective-component-provided workpiece forming step 1004, the sheet-shaped protective component 110 is heated and softened from the pressing surface 51 by the heat source 52 disposed inside the pressing component 50.

In the protective-component-provided workpiece forming step 1004, while the sheet-shaped protective component 110 and the workpiece 1 are heated at a predetermined temperature (in the first embodiment, for example, 50° C. to 150° C.) by the heat sources 42 and 52 as above, the surface 113 of the sheet-shaped protective component 110 is pressed against the front surface 4 of the workpiece 1 by the pressing surface 51 that is set parallel to the holding surface 41, with a predetermined pressing force (in the first embodiment, for example, 0.3 MPa or higher) for a predetermined time (in the first embodiment, for example, 30 seconds) or longer. Thus, the sheet-shaped protective component 110 and the workpiece 1 are integrated.

Note that, in the protective-component-provided workpiece forming step 1004, in the first embodiment, the sheet-shaped protective component 110 is integrated with the workpiece 1 with the sheet-shaped protective component 110 positioned on the upper side and with the workpiece 1 positioned on the lower side. However, the present invention is not limited to this configuration, and the position of the sheet-shaped protective component 110 and the position of the workpiece 1 in the vertical direction may be switched, and the sheet-shaped protective component 110 may be integrated with the workpiece 1.

In the protective-component-provided workpiece forming step 1004, because the holding surface 41 and the pressing surface 51 are both flat and are parallel to each other, the sheet-shaped protective component 110 is integrated with the workpiece 1 in such a manner that the surface 114, which is an exposed surface of the sheet-shaped protective component 110, and the back surface 7 of the workpiece 1 become parallel to each other.

In the protective-component-provided workpiece forming step 1004, the sheet-shaped protective component 110, which is formed by applying the ultraviolet rays 29 to and curing the mixed resin 102 obtained by homogeneously mixing the thermoplastic resin 101 whose solubility parameter is equal to or higher than 8.5 with the liquid ultraviolet-curable resin 100, is brought into close contact with and integrated with the front surface 4 of the workpiece 1. Thus, the heating temperature and the heating time are reduced compared with the case in which the thermoplastic resin 101 is softened and is formed into a sheet shape on the workpiece 1. Therefore, shrinkage due to cooling of the thermoplastic resin 101 is suppressed, and the desired shape and size at the time of formation of the sheet-shaped protective component 110 can be maintained.

In the protective-component-provided workpiece forming step 1004, it is preferable to heat and soften a region of the sheet-shaped protective component 110 that is brought into close contact with the workpiece 1, by the heat sources 42 and 52 in a limited manner. Thus, the heat sources 42 and 52 may be disposed in a limited manner so as to face the region of the sheet-shaped protective component 110 that is brought into close contact with the workpiece 1. In the first embodiment, as illustrated in FIG. 9, the heat source 42 is disposed in a limited manner so as to face the region of the sheet-shaped protective component 110 that is brought into close contact with and integrated with the workpiece 1.

Further, the protective-component-provided workpiece forming step 1004 is not limited to the method in which the sheet-shaped protective component 110 is brought into close contact with and integrated with the workpiece 1 by the suction holding table 40 and the pressing component 50. The sheet-shaped protective component 110 may be brought into close contact with the workpiece 1 by rotationally moving a roller from one end of the front surface 4 of the workpiece 1 toward the other end with the interposition of the sheet-shaped protective component 110 oriented toward the front surface 4 of the workpiece 1. At this time, while the sheet-shaped protective component 110 is heated to a predetermined temperature (in the first embodiment, for example, 150° C. or higher) and is softened by a predetermined heat source disposed on the side where the workpiece 1 is held, a heat source disposed inside the roller, or the like, the sheet-shaped protective component 110 is pressed against the workpiece 1 from the side of the surface 114 by the roller with a predetermined pressing force (in the first embodiment, for example, 0.3 MPa or higher). Thus, thermocompression bonding of the surface 113 of the softened sheet-shaped protective component 110 to the front surface 4 of the workpiece 1 is executed to cause the close contact and the integration. Moreover, the protective-component-provided workpiece forming step 1004 may be executed as follows. The sheet-shaped protective component 110 is sequentially placed from one end of the front surface 4 of the workpiece 1 by rotationally moving a roller similarly. Then, the sheet-shaped protective component 110 is heated and softened by blowing hot air at a predetermined temperature (in the first embodiment, for example, 150° C. or higher) by a dryer for industrial use from the side of the sheet-shaped protective component 110. Thus, the surface 113 of the softened sheet-shaped protective component 110 is brought into close contact with and integrated with the front surface 4 of the workpiece 1 without pressing the sheet-shaped protective component 110 against the workpiece 1, that is, under the condition in which the pressing force is 0 MPa.

Further, the protective-component-provided workpiece forming step 1004 may be executed in a reduced-pressure chamber. In this case, entry of air bubbles into a space between the sheet-shaped protective component 110 and the workpiece 1 can be suppressed.

The protective component cooling step 1005 is a step of cooling the sheet-shaped protective component 110 brought into close contact with and integrated with the workpiece 1, after the protective-component-provided workpiece forming step 1004. In the protective component cooling step 1005, the sheet-shaped protective component 110 is cooled immediately after the sheet-shaped protective component 110 is brought into close contact with and integrated with the workpiece 1, and the thermoplastic resin 101 contained in the sheet-shaped protective component 110 is thus cured. Therefore, the shape and size of the sheet-shaped protective component 110 can be stabilized.

In the protective component cooling step 1005, in the first embodiment, for example, the cooling of the sheet-shaped protective component 110 is started by turning off the heat sources 42 and 52 to stop the heating of the sheet-shaped protective component 110 by the heat sources 42 and 52, and the sheet-shaped protective component 110 is cooled to approximately the temperature of the atmospheric air by, for example, the atmospheric air.

The protective component cooling step 1005 is not limited to the step described above in the present invention. After the heat sources 42 and 52 are turned off, the sheet-shaped protective component 110 may be cooled from the side of the holding surface 41 and the side of the pressing surface 51 by unillustrated cooling mechanisms of air cooling, water cooling, or the like that are disposed inside the suction holding table 40 and the pressing component 50, in the state in which the sheet-shaped protective component 110 is pressurized by the pressing component 50. Further, in the protective component cooling step 1005, the heating of the sheet-shaped protective component 110 by the heat source 52 may be stopped by separating the pressing component 50 from the sheet-shaped protective component 110, instead of turning off the heat source 52. The protective component cooling step 1005 can be changed as appropriate depending on whether or not the heat sources 42 and 52 are each used for heating and softening of the sheet-shaped protective component 110.

In the first embodiment, after being formed by using the mixed resin 102, the sheet-shaped protective component 110 is brought into close contact with the workpiece 1 and is heated to be integrated with the workpiece 1. Thus, the heating temperature and the heating time are reduced compared with the case in which the thermoplastic resin 101 is softened and is formed into a sheet shape on the workpiece 1. Therefore, shrinkage due to the cooling is also suppressed in the protective component cooling step 1005.

After the protective-component-provided workpiece forming step 1004 and the protective component cooling step 1005 are executed, the pressing component 50 is separated from the sheet-shaped protective component 110, and the workpiece 1 with which the sheet-shaped protective component 110 is brought into close contact and integrated is removed from the suction holding table 40.

Figure 10:
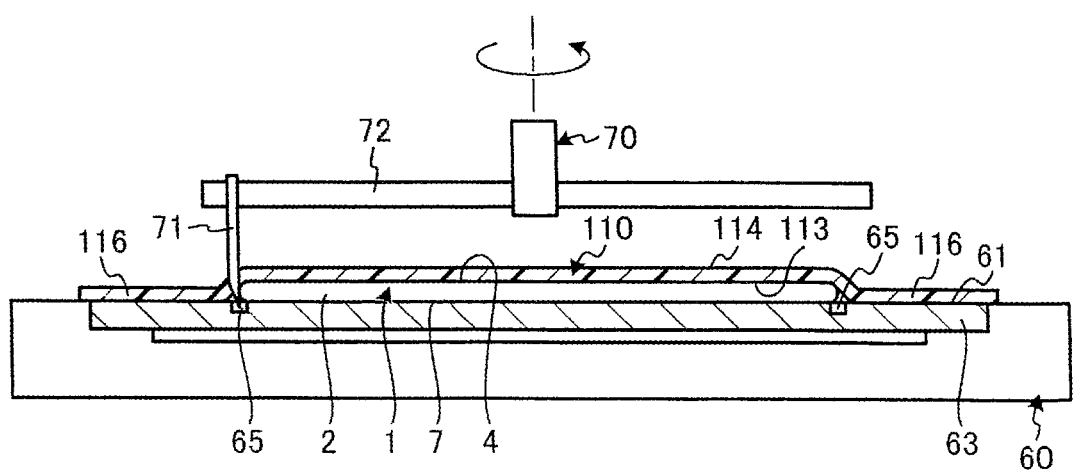
FIG. 10 is a sectional view for explaining a protective component outer circumferential region cutting-off step.

FIG. 10 is a sectional view for explaining a protective component outer circumferential region cutting-off step. In FIG. 10, diagrammatic representation of the bumps 6 is omitted. In the first embodiment, after the workpiece 1 with which the sheet-shaped protective component 110 is brought into close contact and integrated is removed from the suction holding table 40, the protective component outer circumferential region cutting-off step of cutting off an outer circumferential region 116 is executed as illustrated in FIG. 10. The outer circumferential region 116 is a part of the sheet-shaped protective component 110 that is protruding in the radial direction from the outer edge of the workpiece 1.

In the protective component outer circumferential region cutting-off step, first, as illustrated in FIG. 10, the back surface 7 of the workpiece 1 with which the sheet-shaped protective component 110 is brought into close contact and integrated is held under suction by a holding surface 61 of a suction holding table 60. Here, the suction holding table 60 is different from the suction holding table 40 in that the heat source 42 is not provided and that a holding part 63 is provided instead of the holding part 43. The holding part 63 includes a circular annular groove 65 that has a diameter similar to the outer diameter of the workpiece 1 and that is formed in the holding surface 61.

In the protective component outer circumferential region cutting-off step, next, as illustrated in FIG. 10, the outer circumferential region 116 of the sheet-shaped protective component 110 that is brought into close contact with and integrated with the workpiece 1 held by the holding surface 61 of the suction holding table 60 is cut off by a cutter 71 of a cutting-off apparatus 70. Here, the cutting-off apparatus 70 includes a circular plate 72 that holds the cutter 71 toward the outer edge of the workpiece 1 and a rotational drive source that rotationally drives the circular plate 72 around the axial center and that is not illustrated in the diagram. By rotating the circular plate 72 around the axial center by the rotational drive source in the state in which the cutting edge of the cutter 71 is inserted in the groove 65, the cutting-off apparatus 70 causes rotational movement of the cutter 71 along the outer edge of the workpiece 1 and cuts off the outer circumferential region 116 of the protective component 110.

Figure 11:
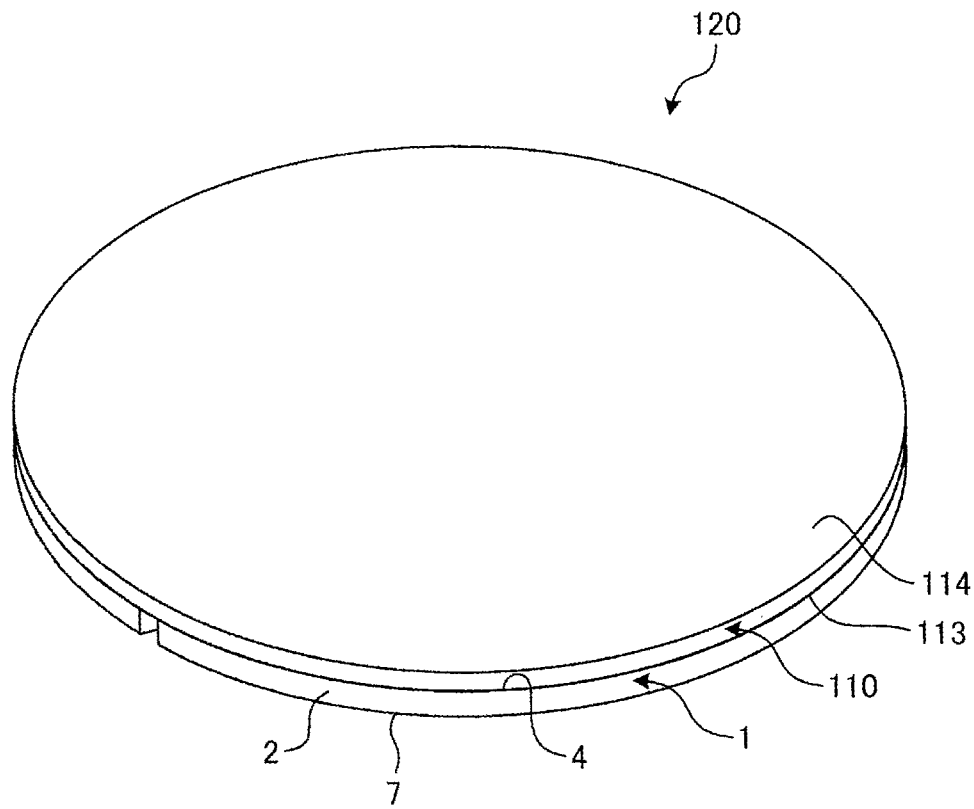
FIG. 11 is a perspective view illustrating a protective-component-provided workpiece manufactured by the manufacturing method of a protective-component-provided workpiece according to the first embodiment.

FIG. 11 is a perspective view illustrating the protective-component-provided workpiece 120 manufactured by the manufacturing method of a protective-component-provided workpiece according to the first embodiment. The protective-component-provided workpiece 120 is formed through the respective steps (steps 1001 to 1005) included in the manufacturing method of a protective-component-provided workpiece according to the above-described first embodiment and has the plate-shaped workpiece 1 and the protective component 110 according to the first embodiment as illustrated in FIG. 11. The protective component 110 according to the first embodiment is in close contact with the front surface 4, which is one surface of the workpiece 1, and protects the workpiece 1 in processing. Further, the protective component 110 according to the first embodiment has a sheet shape and is formed by applying the ultraviolet rays 29 to and curing the mixed resin 102 obtained by homogeneously mixing the thermoplastic resin 101 whose solubility parameter is equal to or higher than 8.5 with the liquid ultraviolet-curable resin 100. That is, in the protective component 110 according to the first embodiment, the cured ultraviolet-curable resin 100 and the thermoplastic resin 101 whose solubility parameter is equal to or higher than 8.5 are both homogenously distributed in the whole thereof. Thus, in the protective component 110 according to the first embodiment, expansion and shrinkage due to temperature change are suppressed in the whole thereof, and the desired shape and size when the protective component 110 is brought into close contact with and integrated with the workpiece 1 can be maintained. Thus, bending and deformation of the workpiece 1 can be suppressed. Further, in the protective component 110 according to the first embodiment, the surface 113 that comes into contact with and is fixed to the workpiece 1 is formed with the thermoplastic resin 101 (mixed resin 102) that includes neither sodium nor zinc, and therefore, the possibility of the occurrence of a malfunction in the device 5 of the workpiece 1 is suppressed.

Figure 12:
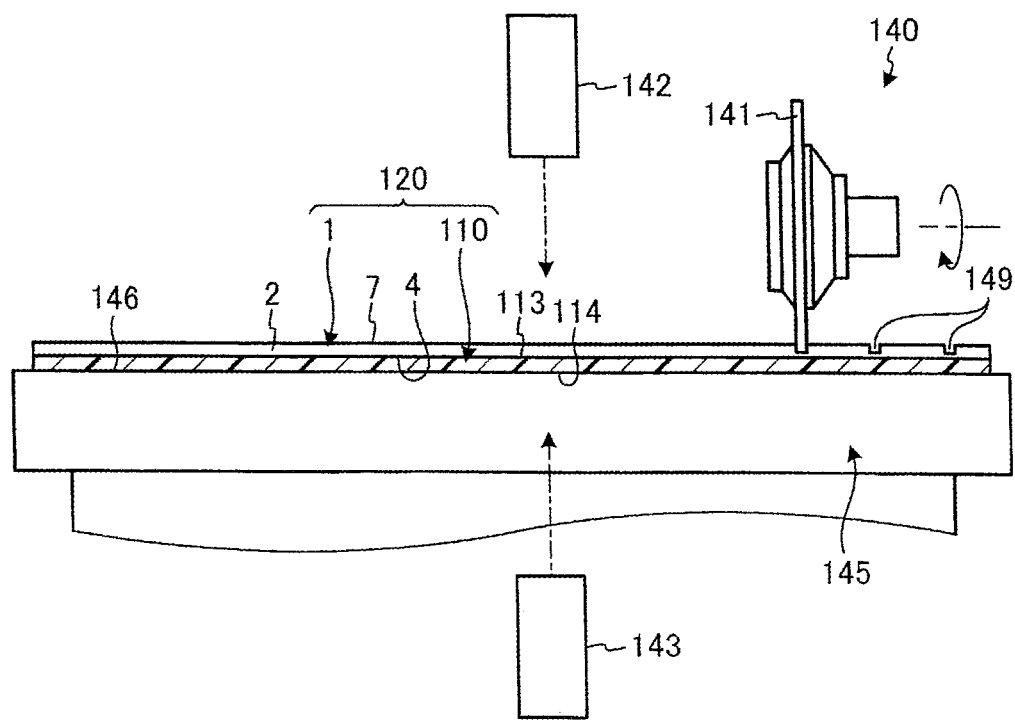
FIG. 12 is a sectional view for explaining cutting processing that is a first example of a processing step in FIG. 2.
Figure 13:
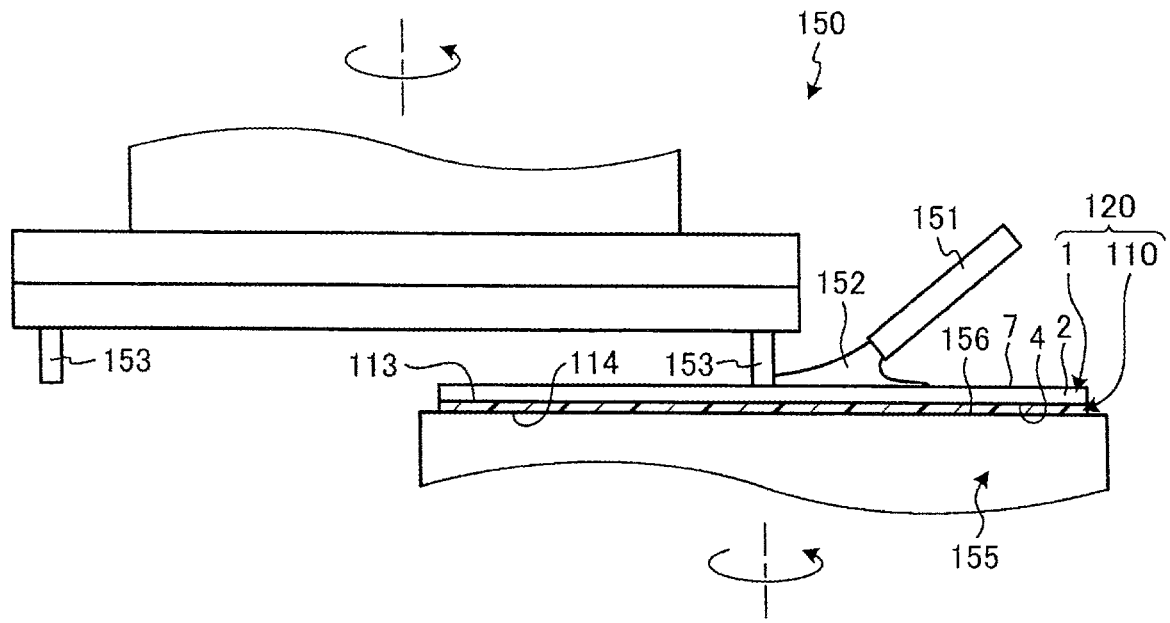
FIG. 13 is a sectional view for explaining grinding processing that is a second example of the processing step in FIG. 2.
Figure 14:
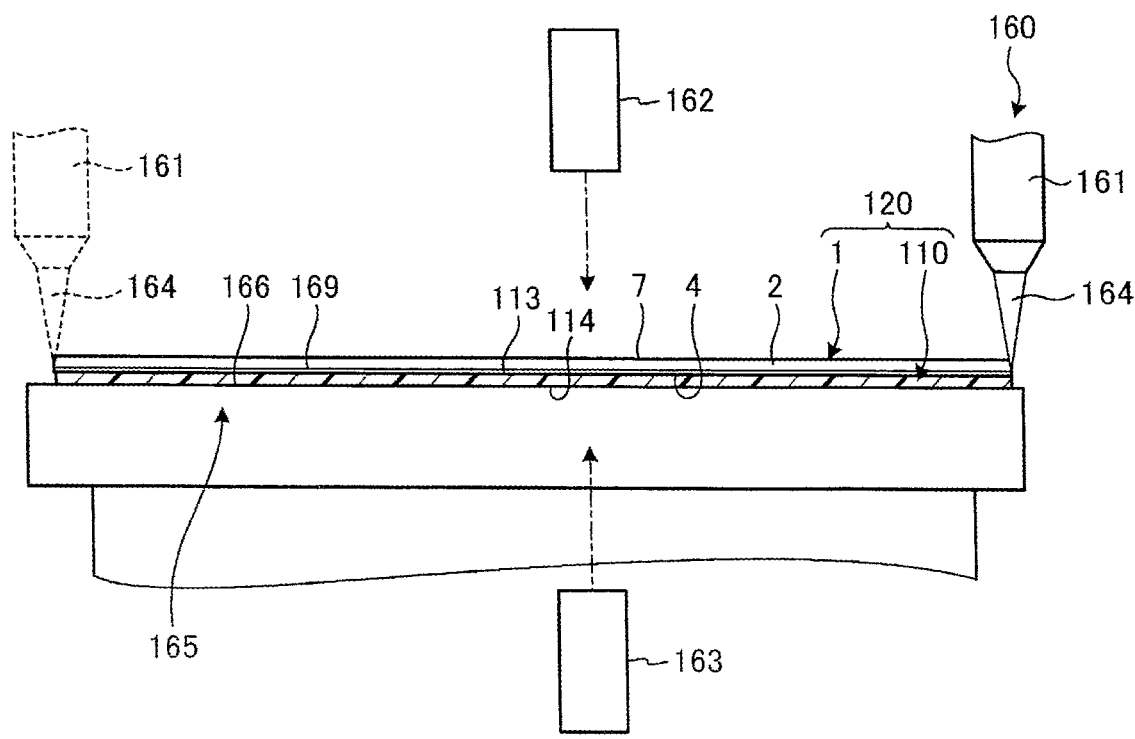
FIG. 14 is a sectional view for explaining laser processing that is a third example of the processing step in FIG. 2.

FIG. 12 is a sectional view for explaining cutting processing that is a first example of the processing step 1006 in FIG. 2. FIG. 13 is a sectional view for explaining grinding processing that is a second example of the processing step 1006 in FIG. 2. FIG. 14 is a sectional view for explaining laser processing that is a third example of the processing step 1006 in FIG. 2. Note that, in FIG. 12 to FIG. 14, diagrammatic representation of the bumps 6 is omitted. The processing step 1006 is a step of holding, by a chuck table 145, 155, or 165, the protective-component-provided workpiece 120, which is formed through the respective steps (steps 1001 to 1005) included in the manufacturing method of a protective-component-provided workpiece according to the first embodiment, from the side where the sheet-shaped protective component 110 is placed, and processing the workpiece 1, as illustrated in FIG. 12, FIG. 13, and FIG. 14.

In the first embodiment, the first example of the processing step 1006 is an example in which cutting processing is executed on the workpiece 1 of the protective-component-provided workpiece 120 from the side of the back surface 7 by a cutting processing apparatus 140. However, the present invention is not limited to this example. In a protective-component-provided workpiece in which the protective component 110 is in close contact with and is integrated with the back surface 7 of the workpiece 1, cutting processing may be executed on the workpiece 1 from the side of the front surface 4. The first example of the processing step 1006 is a method in which the workpiece 1 is cut from the side of the back surface 7 as follows. As illustrated in FIG. 12, in the state in which the protective-component-provided workpiece 120 is held under suction from the side of the protective component 110 by a holding surface 146 of the chuck table 145, a cutting blade 141 mounted in the cutting processing apparatus 140 is rotated around the axial center while a cutting liquid is supplied to the back surface 7 of the workpiece 1. Further, processing feed, indexing feed, and cutting-in feed of the chuck table 145 or the cutting blade 141 of the cutting processing apparatus 140 are executed by a drive source that is not illustrated in the diagram. In the first example of the processing step 1006, for example, by cutting the workpiece 1 from the side of the back surface 7 along the planned dividing lines 3, cut grooves 149 are each formed between adjacent ones of the devices 5 of the workpiece 1. In the first example of the processing step 1006, the protective component 110 mixed with fillers may be used. In this case, by causing the cutting blade 141 to cut into the protective component 110, wear of the cutting blade 141 is promoted by the fillers, and a dressing effect of the cutting blade 141 is produced.

In the first embodiment, the second example of the processing step 1006 is an example in which grinding processing is executed on the workpiece 1 of the protective-component-provided workpiece 120 from the side of the back surface 7 by a grinding processing apparatus 150. In the first embodiment, the second example of the processing step 1006 is an example in which grinding processing is executed on the whole back surface 7 of the workpiece 1. However, the present invention is not limited to this example, and what is called TAIKO (registered trademark)

grinding processing may be executed. In the TAIKO grinding processing, a side end part at the outermost circumference of the workpiece 1 is left, and only the inner circumference thereof is ground from the side of the back surface 7 to thin the workpiece 1. In the second example of the processing step 1006, as illustrated in FIG. 13, the chuck table 155 is rotated around the axial center by a rotational drive source that is not illustrated in the diagram, in the state in which the protective-component-provided workpiece 120 is held under suction from the side of the protective component 110 by a holding surface 156 of the chuck table 155. At the same time, while a grinding liquid 152 is supplied to the back surface 7 of the workpiece 1 from a grinding liquid supply part 151 of the grinding processing apparatus 150, grinding abrasive stones 153 mounted in the grinding processing apparatus 150 are rotate around the axial center and are brought into contact with the back surface 7 of the workpiece 1 to execute the grinding.

In the first embodiment, the third example of the processing step 1006 is an example in which laser processing is executed on the workpiece 1 of the protective-component-provided workpiece 120 from the side of the back surface 7 by a laser processing apparatus 160. However, the present invention is not limited to this example. In a protective-component-provided workpiece in which the protective component 110 is in close contact with and is integrated with the back surface 7 of the workpiece 1, laser processing may be executed on the workpiece 1 from the side of the front surface 4. The third example of the processing step 1006 is a method executed as follows. As illustrated in FIG. 14, in the state in which the protective-component-provided workpiece 120 is held under suction from the side of the protective component 110 by a holding surface 166 of the chuck table 165, the chuck table 165 or a laser irradiator 161 is relatively moved by an unillustrated drive source while the back surface 7 of the workpiece 1 is irradiated from the laser irradiator 161 with a laser beam 164 with a wavelength having absorbability with respect to the workpiece 1 or a wavelength having transmissibility with respect to the workpiece 1. Thus, what is called ablation processing in which the workpiece 1 is sublimed or evaporated from the side of the back surface 7 by the laser beam 164 is executed, or a modified layer is formed inside the workpiece 1. In the third example of the processing step 1006 according to the first embodiment, for example, laser processing (ablation processing) is executed on the workpiece 1 from the side of the back surface 7 along the planned dividing lines 3 to form laser-processed grooves 169. Thus, the workpiece 1 is divided (fully cut) into the respective devices 5, or the modified layer is formed inside the workpiece 1, for example. Note that, in the third example of the processing step 1006, the laser beam 164 in a pulsed manner may be used.

In the third example of the processing step 1006, laser processing may be executed on the workpiece 1 of the protective-component-provided workpiece 120 from the side on which the protective component 110 is fixed. In this case, the protective component 110 suppresses adhesion of debris generated in the ablation processing to the workpiece 1 or the devices 5.

In the cutting processing of the first example and the laser processing of the third example regarding the processing step 1006, the workpiece 1 may be processed after an image of a pattern of the devices 5 or the planned dividing lines 3 on the front surface 4 of the workpiece 1 is captured from the side of the back surface 7 by a camera unit 142 or 162 of a visible light camera, an infrared camera, or the like disposed over the chuck table 145 or 165 and alignment to identify the planned dividing line 3 that is a region to be processed is executed based on the position of the captured pattern. Further, in the cutting processing of the first example and the laser processing of the third example regarding the processing step 1006, in the case in which the workpiece 1 is held by using the chuck table 145 or 165 of glass or the like with translucency and alignment is executed on the workpiece 1 from the side on which the protective component 110 is fixed, the alignment can be executed with high accuracy because the protective component 110 can be formed so as to have translucency. Moreover, also in the case in which the nanofillers are mixed in the protective component 110, the alignment can be executed with high accuracy because the protective component 110 has favorable translucency.

The protective component separation step 1007 is a step of separating the sheet-shaped protective component 110 from the workpiece 1 after the execution of the processing step 1006. In the protective component separation step 1007, the protective component 110 of the protective-component-provided workpiece 120 or the like does not have adhesiveness like that of an adhesive substantially. Thus, excessive adhesion to the front surface 4 of the workpiece 1 is suppressed, and the protective component 110 is in close contact with the workpiece 1 with a substantially uniform adhesive force because the thermoplastic resin 101 is homogeneously distributed. Therefore, the protective component 110 can easily be separated from the workpiece 1.

In the manufacturing method of a protective-component-provided workpiece, the processing method of a workpiece, and the protective component for a workpiece according to the first embodiment having the above-described configuration, unlike an adhesive layer used for an adhesive tape, the protective component 110 does not substantially have such excessive adhesiveness that is exhibited by an adhesive, in general, and has such a property as not substantially exhibit excessive adhesiveness when the protective component 110 is cooled and solidified. Therefore, the protective component 110 does not remain on the workpiece 1 as a residue when being separated from the workpiece 1. Further, the occurrence of the situation in which the protective component 110 becomes a cushion in processing is suppressed, and thus, the possibility of the occurrence of a phenomenon in which the workpiece 1 breaks due to execution of processing treatment can be reduced.

Moreover, in the manufacturing method of a protective-component-provided workpiece, the processing method of a workpiece, and the protective component for a workpiece according to the first embodiment, the mixed resin 102 is cured by the ultraviolet rays 29 and is formed into a sheet shape. Thus, softening and expansion due to heating do not occur, and shrinkage due to cooling does not occur. Consequently, the shape and the size can be maintained. Therefore, such action and effects that allow formation into the desired shape and size (thickness and area) and reduction in variation in the shape and the size are provided.

Further, in the manufacturing method of a protective-component-provided workpiece, the processing method of a workpiece, and the protective component for a workpiece according to the first embodiment, the surface 113 of the protective component 110 that is brought into contact with and fixed to the workpiece 1 includes neither sodium nor zinc. Therefore, such action and effect that suppress the possibility of the occurrence of a malfunction in the device 5 of the workpiece 1 are provided. Note that, in the manufacturing method of a protective-component-provided workpiece, the processing method of a workpiece, and the protective component for a workpiece according to the first embodiment, a sheet of any thermoplastic resin may be stacked on the surface 114 of the protective component 110, which is opposite to the surface 113 that is brought into contact with and fixed to the workpiece 1, in such a range as not to contradict the object of the present invention.

Second Embodiment

Figure 15:
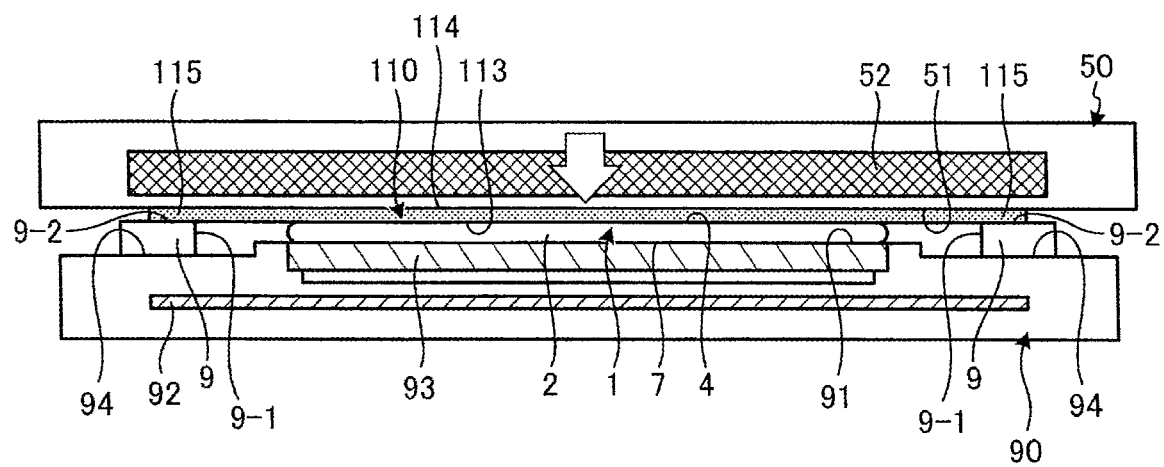
FIG. 15 is a sectional view for explaining a protective-component-provided workpiece forming step that is included in a manufacturing method of a protective-component-provided workpiece according to a second embodiment.
Figure 16:
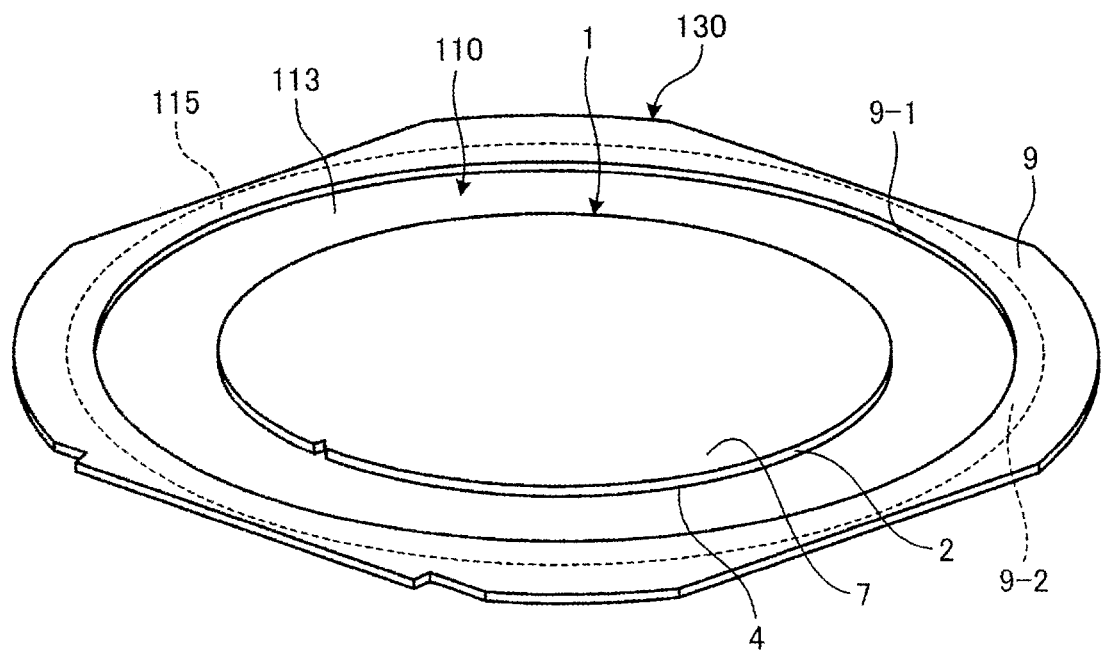
FIG. 16 is a perspective view illustrating a protective-component-provided workpiece manufactured by the manufacturing method of a protective-component-provided workpiece according to the second embodiment.

A manufacturing method of a protective-component-provided workpiece, a processing method of a workpiece, and a protective component for a workpiece according to a second embodiment of the present invention will be described based on drawings. FIG. 15 is a sectional view for explaining a protective-component-provided workpiece forming step 1004 that is included in the manufacturing method of a protective-component-provided workpiece according to the second embodiment. FIG. 16 is a perspective view illustrating a protective-component-provided workpiece 130 manufactured by the manufacturing method of a protective-component-provided workpiece according to the second embodiment. Note that, in FIG. 15, diagrammatic representation of the bumps 6 is omitted. In FIG. 15 and FIG. 16, the same part as the first embodiment is given the same reference sign, and description thereof is omitted.

The manufacturing method of a protective-component-provided workpiece according to the second embodiment is a method obtained by changing the protective-component-provided workpiece forming step 1004 in the first embodiment. The processing method of a workpiece according to the second embodiment is a step obtained by changing the protective-component-provided workpiece forming step 1004 and the processing step 1006 in the first embodiment. In the protective-component-provided workpiece forming step 1004 according to the second embodiment, as illustrated in FIG. 15, when the surface 113 of the sheet-shaped protective component 110 is brought into close contact with the front surface 4 of the workpiece 1 to integrate the protective component 110 with the workpiece 1 as in the first embodiment, the surface 113 is also brought into close contact with a surface 9-2 of a metal frame 9 that houses the workpiece 1, to integrate the protective component 110 with the metal frame 9. Thus, the protective-component-provided workpiece 130 with the metal frame 9 illustrated in FIG. 16 is obtained.

The metal frame 9 used in the protective-component-provided workpiece forming step 1004 according to the second embodiment is made of a metal and is made of, for example, stainless steel (SUS). The metal frame 9 has a circular opening 9-1 at the center thereof and is formed into a plate shape. The inner diameter of the opening 9-1 of the metal frame 9 is larger than the outer diameter of the workpiece 1.

In the protective-component-provided workpiece forming step 1004 according to the second embodiment, as illustrated in FIG. 15, the metal frame 9 is placed on a frame placement part 94 that is recessed in a circular annular manner and formed in a region at the outer circumference of a holding surface 91 of a suction holding table 90. In addition, the workpiece 1 with which the sheet-shaped protective component 110 is brought into close contact similarly to the first embodiment is placed on the holding surface 91 of the suction holding table 90 corresponding to the position at which the workpiece 1 is housed in the opening 9-1 of the metal frame 9, with the side of the workpiece 1 oriented downward, and is held under suction by the suction holding table 90. The suction holding table 90 includes a holding part 93 similar to the suction holding table 40 and holds the workpiece 1 under suction by the holding surface 91 with a mechanism similar to the suction holding table 40. In the protective-component-provided workpiece forming step 1004 according to the second embodiment, with the workpiece 1 held under suction by the holding surface 91, an outer circumferential region 115 of the sheet-shaped protective component 110 is placed on the surface 9-2 of the metal frame 9.

Note that, in the sheet-shaped protective component 110 used in the protective-component-provided workpiece forming step 1004 according to the second embodiment, the circular annular outer circumferential region 115 (see FIG. 15 and FIG. 16) on the surface 113 that is brought into contact with and fixed to the metal frame 9 may be formed of the mixed resin 102 containing the thermoplastic resin 101 having an ethylene-unsaturated carboxylic acid copolymer as a main component. Here, it is assumed that, in a case in which the thermoplastic resin 101 has an ethylene-unsaturated carboxylic acid copolymer (ethylene-unsaturated carboxylic acid copolymer resin) as a main component, the ratio of the mass of the unsaturated carboxylic acid to the mass obtained by removing fillers including the nanofillers and other various compounding agents from the whole of the thermoplastic resin 101 is at least 1 mass %, and is preferably equal to or higher than 5 mass %, and is more preferably equal to or higher than 10 mass %. Note that the ratio of the mass of the unsaturated carboxylic acid to the mass obtained by removing fillers including the nanofillers and other various compounding agents from the whole of the thermoplastic resin 101 is equal to or lower than 50 mass %. In such a thermoplastic resin 101, for example, the ethylene-unsaturated carboxylic acid copolymer includes a methacrylic acid polymer, acrylic acid polymer, or the like. Such a sheet-shaped protective component 110 exerts a high fixing force for the metal frame 9 and is favorably fixed to the metal frame 9. Thus, the protective-component-provided workpiece 130 can favorably be formed. This makes it possible to reduce the fear that this sheet-shaped protective component 110 separates from the metal frame 9 in processing or in conveyance.

Further, in the protective-component-provided workpiece forming step 1004 according to the second embodiment, an adhesion promoting component that promotes adhesion of the thermoplastic resin 101 to the metal frame 9 may be disposed between the surface 9-2 of the metal frame 9 and the outer circumferential region 115 of the protective component 110. In addition, the adhesion promoting component may be disposed on the surface 9-2 of the metal frame 9. Here, the adhesion promoting component is formed of a material that promotes the adhesion reaction between the metal frame 9 and the thermoplastic resin 101.

In the protective-component-provided workpiece forming step 1004 according to the second embodiment, then, the sheet-shaped protective component 110 is heated and softened from the side of the holding surface 91 through the workpiece 1 and the metal frame 9 by a heat source 92 disposed inside the suction holding table 90. Further, in the protective-component-provided workpiece forming step 1004 according to the second embodiment, as illustrated in FIG. 15, the flat pressing surface 51 of the pressing component 50 is brought close to the front surface 4 of the workpiece 1 held under suction by the suction holding table 90 and to the surface 114 of the sheet-shaped protective component 110 in close contact with the surface 9-2 of the metal frame 9, and is brought into contact with the surface 114 from the side opposite to the side where the holding surface 91 is placed. Moreover, in the protective-component-provided workpiece forming step 1004 according to the second embodiment, the sheet-shaped protective component 110 is heated and softened from the side of the pressing surface 51 by the heat source 52 disposed inside the pressing component 50.

In the protective-component-provided workpiece forming step 1004 according to the second embodiment, while the side of the one surface 113 of the sheet-shaped protective component 110 and the side of the front surface 4 of the workpiece 1 are heated by the heat sources 52 and 92 as above, the surface 113 of the sheet-shaped protective component 110 is pressed against the front surface 4 of the workpiece 1 and the surface 9-2 of the metal frame 9 by the pressing surface 51 set parallel to the holding surface 91 for a predetermined time or longer. Thus, the sheet-shaped protective component 110, the workpiece 1, and the metal frame 9 are integrated.

Further, in the protective-component-provided workpiece forming step 1004 according to the second embodiment, similarly to the protective-component-provided workpiece forming step 1004 according to the first embodiment, thermocompression bonding treatment of the sheet-shaped protective component 110 to the workpiece 1 and the metal frame 9 may be executed by using a roller under a similar temperature condition and a similar pressing condition. Moreover, in the protective-component-provided workpiece forming step 1004 according to the second embodiment, similarly to the protective-component-provided workpiece forming step 1004 according to the first embodiment, treatment of close contact and integration of the sheet-shaped protective component 110 with the workpiece 1 and the metal frame 9 may be executed by using a dryer for industrial use under a similar temperature condition after the sheet-shaped protective component 110 is brought into close contact with and integrated with the workpiece 1 and the metal frame 9 by using a roller under a similar pressing condition.

After the protective-component-provided workpiece forming step 1004 according to the second embodiment, the protective-component-provided workpiece 130 formed by causing the sheet-shaped protective component 110 to come into close contact with and integrate with the front surface 4 of the workpiece 1 and the surface 9-2 of the metal frame 9 is removed from the suction holding table 90. As illustrated in FIG. 16, the protective-component-provided workpiece 130 has the plate-shaped workpiece 1, the protective component 110 according to the second embodiment, and the metal frame 9 that houses the workpiece 1 in the opening 9-1 on the surface 113 of the protective component 110. The protective component 110 according to the second embodiment is the same as the protective component 110 according to the first embodiment except that the protective component 110 is in close contact with the surface 9-2 of the metal frame 9 and is integrated with the metal frame 9.

The processing step 1006 included in the processing method of a workpiece according to the second embodiment is a step of holding, by the chuck table 145, 155, or 165, the sheet-shaped protective component 110 of the protective-component-provided workpiece 130 formed through the respective steps (steps 1001 to 1005) included in the manufacturing method of a protective-component-provided workpiece according to the second embodiment, and processing the workpiece 1 similarly to the above-described processing step 1006. That is, the processing step 1006 included in the processing method of a workpiece according to the second embodiment is different from that of the first embodiment in that a target to be held by the chuck table 145, 155, or 165 to process the workpiece 1 is changed to the protective-component-provided workpiece 130 with the metal frame 9, or the like.

Third Embodiment

Figure 17:
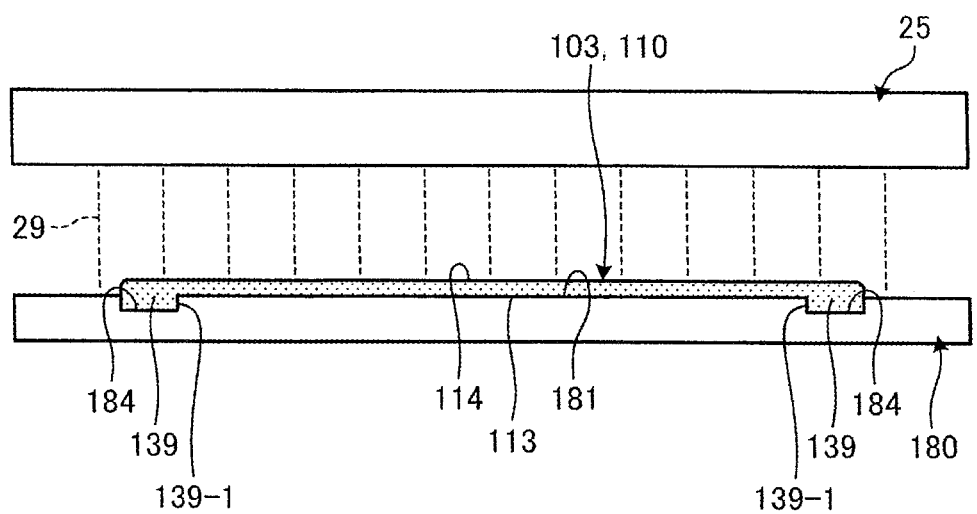
FIG. 17 is a sectional view for explaining a resin layer forming step and a protective component forming step that are included in a manufacturing method of a protective-component-provided workpiece according to a third embodiment.
Figure 18:
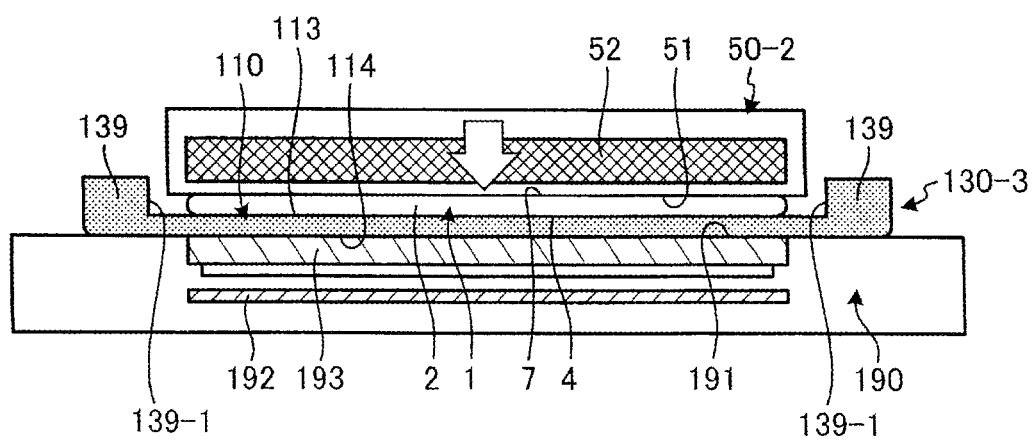
FIG. 18 is a sectional view for explaining a protective-component-provided workpiece forming step that is included in the manufacturing method of a protective-component-provided workpiece according to the third embodiment.

A manufacturing method of a protective-component-provided workpiece, a processing method of a workpiece, and a protective component for a workpiece according to a third embodiment of the present invention will be described based on drawings. FIG. 17 is a sectional view for explaining a resin layer forming step 1002 and a protective component forming step 1003 that are included in the manufacturing method of a protective-component-provided workpiece according to the third embodiment. FIG. 18 is a sectional view for explaining a protective-component-provided workpiece forming step 1004 that is included in the manufacturing method of a protective-component-provided workpiece according to the third embodiment. Note that, in FIG. 18, diagrammatic representation of the bumps 6 is omitted. In FIG. 17 and FIG. 18, the same part as the first embodiment and the second embodiment is given the same reference sign, and description thereof is omitted.

The manufacturing method of a protective-component-provided workpiece according to the third embodiment is a method obtained by changing the resin layer forming step 1002, the protective component forming step 1003, and the protective-component-provided workpiece forming step 1004 in the first embodiment. The processing method of a workpiece according to the third embodiment is a method obtained by further changing the processing step 1006 in the second embodiment.

The resin layer forming step 1002 according to the third embodiment is a step in which a large-thickness part 139 of the liquid mixed resin 102 is further formed at the outer circumferential edge of the resin layer 103 used in the first embodiment, as illustrated in FIG. 17. Further, the protective component forming step 1003 according to the third embodiment is a step in which the large-thickness part 139 of the liquid mixed resin 102 is further formed at the outer circumferential edge of the sheet-shaped protective component 110 used in the first embodiment, as illustrated in FIG. 17. Here, the large-thickness part 139 refers to a part thicker than the inside region (sheet-shaped region) of the resin layer 103 or the sheet-shaped protective component 110. In the third embodiment, for example, the large-thickness part 139 is thicker than the sheet-shaped region of the resin layer 103 or the sheet-shaped protective component 110 by the thickness equivalent to that of the metal frame 9 of the second embodiment.

In the resin layer forming step 1002 according to the third embodiment, the liquid mixed resin 102 is supplied to a flat support surface 181 of a support table 180 and to a groove part 184 recessed in a circular annular manner and formed in a region at the outer circumference of the support surface 181. Here, the inner diameter of the groove part 184 is larger than the outer diameter of the workpiece 1. In the protective component forming step 1003, as illustrated in FIG. 17, the ultraviolet irradiator 25 is brought close over the resin layer 103 formed on the support surface 181 of the support table 180 and formed in the groove part 184, and irradiation with the ultraviolet rays 29 is executed over the whole surface of the resin layer 103 by the ultraviolet irradiator 25. Thus, the mixed resin 102 is cured, and the sheet-shaped protective component 110 with the large-thickness part 139 of the mixed resin 102 at the outer circumferential edge is formed.

Note that, in the third embodiment, an annular frame core material may be supplied to the groove part 184 in the resin layer forming step 1002, and the large-thickness part 139 may be formed with the annular frame core material and the mixed resin 102 in the groove part 184 in the protective component forming step 1003. Here, the annular frame core material is, for example, a core material in which the diameter at the center in the radial direction is equal to that of the groove part 184 and the width and the thickness in the radial direction are smaller than those of the groove part 184.

The protective-component-provided workpiece forming step 1004 according to the third embodiment is different from that of the first embodiment in that a target to be brought into close contact with and integrated with the front surface 4 of the workpiece 1 is changed to the sheet-shaped protective component 110 with the large-thickness part 139 as illustrated in FIG. 18. In the protective-component-provided workpiece forming step 1004 according to the third embodiment, first, the surface 113 of the sheet-shaped region of the sheet-shaped protective component 110 that is a surface from which the large-thickness part 139 is protruding (bottom surface of the recess surrounded by the large-thickness part 139) is brought into close contact with the front surface 4 of the workpiece 1 by a method similar to the first embodiment.

In the protective-component-provided workpiece forming step 1004 according to the third embodiment, after the front surface 4 of the workpiece 1 is brought into close contact with the surface 113 of the sheet-shaped protective component 110 with the large-thickness part 139, as illustrated in FIG. 18, the sheet-shaped protective component 110 with the large-thickness part 139 is oriented toward a holding surface 191 of a suction holding table 190, is placed thereon, and is held under suction, and the sheet-shaped protective component 110 with the large-thickness part 139 is heated and softened from the side of the holding surface 191 by a heat source 192 disposed inside the suction holding table 190. The suction holding table 190 includes a holding part 193 similar to the suction holding table 40 and holds the workpiece 1 under suction by the holding surface 191 with a mechanism similar to the suction holding table 40. Further, in the protective-component-provided workpiece forming step 1004 according to the third embodiment, a pressing surface 51 of a pressing component 50-2 is brought close to and into contact with the workpiece 1 with which the surface 113 of the sheet-shaped protective component 110 with the large-thickness part 139 held under suction by the suction holding table 190 is in close contact, from the side opposite to the side where the holding surface 191 is placed, and the sheet-shaped protective component 110 with the large-thickness part 139 is further heated and softened from the side of the pressing surface 51 through the workpiece 1 by a heat source 52 of the pressing component 50-2. Moreover, in the protective-component-provided workpiece forming step 1004 according to the third embodiment, the workpiece 1 is pressed against the softened sheet-shaped protective component 110 with the large-thickness part 139 by the pressing surface 51 set parallel to the holding surface 191, to integrate the workpiece 1 with the sheet-shaped protective component 110 with the large-thickness part 139. Here, the pressing component 50-2 is obtained by setting the width of the pressing component 50 in the radial direction smaller than the inner diameter of the surface 113 of the sheet-shaped protective component 110 with the large-thickness part 139.

Further, in the protective-component-provided workpiece forming step 1004 according to the third embodiment, similarly to the protective-component-provided workpiece forming step 1004 according to the first embodiment, thermocompression bonding treatment of the sheet-shaped protective component 110 with the large-thickness part 139 to the workpiece 1 may be executed by using a roller under a similar temperature condition and a similar pressing condition. Moreover, in the protective-component-provided workpiece forming step 1004 according to the third embodiment, similarly to the protective-component-provided workpiece forming step 1004 according to the first embodiment, treatment of close contact and integration of the sheet-shaped protective component 110 with the large-thickness part 139 with the workpiece 1 may be executed by using a dryer for industrial use under a similar temperature condition after the sheet-shaped protective component 110 with the large-thickness part 139 is brought into close contact with and integrated with the workpiece 1 by using a roller under a similar pressing condition.

In the protective-component-provided workpiece forming step 1004 according to this third embodiment, a protective-component-provided workpiece 130-3 is obtained. The protective-component-provided workpiece 130-3 according to the third embodiment is a form obtained by changing the metal frame 9, which is used in the protective-component-provided workpiece 130 according to the second embodiment, to the large-thickness part 139 that houses the workpiece 1 in an opening 139-1. As illustrated in FIG. 18, the protective-component-provided workpiece 130-3 has the plate-shaped workpiece 1 and the protective component 110 according to the third embodiment. The protective component 110 according to the third embodiment is obtained by further making the large-thickness part 139 formed of the liquid mixed resin 102 at the outer circumferential edge of the protective component 110 according to the first embodiment. The processing method of a workpiece according to the third embodiment is substantially similar to that of the second embodiment, and instead of the metal frame 9, the large-thickness part 139 is held by the chuck table 145, 155, or 165 in processing of the workpiece 1 in the processing step 1006.

The manufacturing method of a protective-component-provided workpiece, the processing method of a workpiece, and the protective component for a workpiece according to the third embodiment having the above configuration are different from those of the first embodiment in that a target to be brought into close contact with and integrated with the front surface 4 of the workpiece 1 is changed to the sheet-shaped protective component 110 with the large-thickness part 139, and therefore, provide the action and effects similar to those of the first embodiment and the second embodiment.

Working Example

Next, the inventors of the present invention investigated the action and effects of the manufacturing method of a protective-component-provided workpiece, the processing method of a workpiece, and the protective component for a workpiece according to the first embodiment. FIG. 19 is a diagram for explaining the action and effects of the manufacturing method of a protective-component-provided workpiece, the processing method of a workpiece, and the protective component for a workpiece according to the first embodiment. FIG. 19 collectively illustrates results obtained when the action and effects of the first embodiment were investigated.

FIG. 19 illustrates the following factors: the mixing ratio of an ultraviolet-curable resin to a thermoplastic resin when a liquid mixed resin was obtained by mixing the liquid ultraviolet-curable resin with the thermoplastic resin by a method similar to the mixed resin preparation step 1001 included in the manufacturing method of a protective-component-provided workpiece according to the first embodiment; the shaping evaluation of a protective component when the sheet-shaped protective component was obtained by a method similar to the resin layer forming step 1002 and the protective component forming step 1003 included in the manufacturing method of a protective-component-provided workpiece according to the first embodiment; and the separation evaluation of the protective component when the sheet-shaped protective component that had been integrated with the workpiece 1 and the workpiece 1 of which had been processed was separated from the workpiece 1 by a method similar to the protective-component-provided workpiece forming step 1004, the processing step 1006, and the protective component separation step 1007 included in the manufacturing method of a protective-component-provided workpiece according to the first embodiment.

The column of the "mixing ratio" in FIG. 19 illustrates the mass ratio of the ultraviolet-curable resin to the thermoplastic resin, which were mixed in order to obtain the liquid mixed resin. In the column of the "shaping evaluation" in FIG. 19, "○" indicates a result that the time required for the liquid mixed resin to form a resin layer with a predetermined thickness was sufficiently short and that variation in the thickness of the formed resin layer was sufficiently small. In addition, "x" indicates a result that the time required for the liquid mixed resin to form the resin layer with the predetermined thickness was equal to or longer than a certain time or that variation in the thickness of the formed resin layer was equal to or larger than a certain degree. In the column of the "separation evaluation" in FIG. 19, "○" indicates a result that the sheet-shaped protective component could easily be separated from the workpiece 1 without a residue, and "x" indicates a result that a residue remained on the workpiece 1 from which the sheet-shaped protective component had been separated or that the sheet-shaped protective component could not be separated easily.

Note that, in all of comparative examples 1 and 2 and present invention products or the like 1, 2, and 3 according to the present working example, the same ultraviolet-curable resin and thermoplastic resin were used. As illustrated in FIG. 19, in "comparative example 1," the sheet-shaped protective component was formed by using the mixed resin obtained by mixing the ultraviolet-curable resin and the thermoplastic resin at a mass ratio of 2:8. In "present invention product or the like 1," the sheet-shaped protective component was formed by using the mixed resin obtained by mixing the ultraviolet-curable resin and the thermoplastic resin at a mass ratio of 3:7. In "present invention product or the like 2," the sheet-shaped protective component was formed by using the mixed resin obtained by mixing the ultraviolet-curable resin and the thermoplastic resin at a mass ratio of 6:4. In "present invention product or the like 3," the sheet-shaped protective component was formed by using the mixed resin obtained by mixing the ultraviolet-curable resin and the thermoplastic resin at a mass ratio of 7:3. In "comparative example 2," the sheet-shaped protective component was formed by using the mixed resin obtained by mixing the ultraviolet-curable resin and the thermoplastic resin at a mass ratio of 8:2.

As illustrated in present invention products or the like 1, 2, and 3 in FIG. 19, when the sheet-shaped protective component was formed by using the mixed resin obtained by mixing the ultraviolet-curable resin and the thermoplastic resin at 3:7 to 7:3, the resin layer, i.e. the sheet-shaped protective component, that had a predetermined thickness and that is sufficiently small variation in the thickness could be formed in a sufficiently short time, and the sheet-shaped protective component could be separated easily without a residue on the workpiece 1 when being separated from the workpiece 1 with which the sheet-shaped protective component was brought into close contact and integrated. On the other hand, as illustrated in comparative example 1 in FIG. 19, when the sheet-shaped protective component was formed by using the mixed resin obtained by mixing the ultraviolet-curable resin and the thermoplastic resin at 2:8, because the amount of ultraviolet-curable resin was small, it was difficult to cure the whole of the resin uniformly, it took a long time to cure the resin, and variation in the thickness became large. In addition, because the amount of thermoplastic resin was large, adhesiveness to the workpiece 1 was too high, and the sheet-shaped protective component could not be separated easily when being separated from the workpiece 1 with which the sheet-shaped protective component was brought into close contact and integrated. Moreover, as illustrated in comparative example 2 in FIG. 19, when the sheet-shaped protective component was formed by using the mixed resin obtained by mixing the ultraviolet-curable resin and the thermoplastic resin at 8:2, although a sufficient shaping evaluation was obtained, a residual ultraviolet-curable resin remained on the workpiece 1 when the sheet-shaped protective component was removed from the workpiece 1 with which the sheet-shaped protective component was brought into close contact and integrated.

Accordingly, in the example illustrated in FIG. 19, it turns out that, by forming the sheet-shaped protective component by using the mixed resin obtained by mixing the ultraviolet-curable resin and the thermoplastic resin at 3:7 to 7:3, the effect of maintaining the shape and the size by the ultraviolet-curable resin and the effect of close contact by the thermoplastic resin are both obtained. As a result, the sheet-shaped protective component with which sufficient shaping evaluation and separation evaluation are obtained can be formed.

Further, a result similar to that in the example illustrated in FIG. 19 was obtained when a sheet-shaped protective component was formed by using the mixed resin arising from mixing at a mass ratio of the ultraviolet-curable resin to the thermoplastic resin which is similar to the mass ratio in the example illustrated in FIG. 19, by methods similar to those of the second embodiment and the third embodiment.

Note that the present invention is not limited to the above-described embodiments. That is, the present invention can be carried out with various modifications without departing from the gist of the present invention. For example, for the purposes of circuit protection from ultraviolet rays and hiding of the circuit, the ultraviolet-curable resin 100 and the thermoplastic resin 101 used in the above-described respective embodiments and modification examples may have a dark color such as black, and an ultraviolet absorber may be mixed and kneaded therein. Further, when the mixed resin 102 is prepared, the liquid ultraviolet-curable resin 100 may be heated to dissolve the thermoplastic resin 101 therein, and stirring may be omitted. Moreover, fillers may be further added after the ultraviolet-curable resin 100 and the thermoplastic resin 101 are mixed.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A manufacturing method of a protective-component-provided workpiece in which a sheet-shaped protective component is brought into contact with one surface of a substrate to manufacture the protective-component-provided workpiece, the manufacturing method comprising:
a mixed resin preparation step of dissolving a thermoplastic resin whose solubility parameter is equal to or higher than 8.5, in a liquid ultraviolet-curable resin, to prepare a liquid mixed resin;
a resin layer forming step of supplying the mixed resin to a support surface of a support table to form a resin layer with a predetermined thickness;
a protective-component forming step of irradiating the resin layer with ultraviolet rays and curing the resin layer to form the protective component with a sheet shape;
a protective-component-provided workpiece forming step of heating the sheet-shaped protective component before or after one surface of the sheet-shaped protective component and the one surface of the substrate are brought into contact with each other, and causing the sheet-shaped protective component to come into contact with the substrate and integrate with the substrate, wherein an outer circumferential region of the sheet-shaped protective component extends at least partially along a side of the substrate and in a radial direction from an outer edge of the substrate;
cooling the sheet-shaped protective component after heating the sheet-shaped protective component;
an outer circumferential region cutting-off step, after the protective-component-provided workpiece forming step, of cutting off the outer circumferential region of the sheet-shaped protective component.

2. The manufacturing method of a protective-component-provided workpiece according to claim 1, wherein devices are formed on the one surface of the substrate.

3. The manufacturing method of a protective-component-provided workpiece according to claim 1, wherein the mixed resin preparation step includes dissolving the thermoplastic resin in the liquid ultraviolet-curable resin so that the mixed resin has a mass ratio of the liquid ultraviolet-curable resin to the thermoplastic resin of 3:7 to 7:3.

4. A processing method comprising:
a processing step of holding, by a chuck table, a sheet-shaped protective component of a protective-component-provided workpiece in which one surface of the sheet-shaped protective component and one surface of a substrate are in contact with each other, the sheet-shaped protective component being formed by applying ultraviolet rays to and curing a mixed resin obtained by mixing a thermoplastic resin whose solubility parameter is equal to or higher than 8.5 with a liquid ultraviolet-curable resin, and processing the protective-component-provided workpiece, wherein an outer circumferential region of the sheet-shaped protective component extends at least partially along a side of the substrate and in a radial direction from an outer edge of the substrate; and
a protective-component separation step of separating the sheet-shaped protective component from the substrate after the processing step is executed.

5. The processing method of claim 4, further comprising:
a mixed resin preparation step of, before the processing step, dissolving the thermoplastic resin whose solubility parameter is equal to or higher than 8.5, in the liquid ultraviolet-curable resin, to prepare the mixed resin in a liquid state;
a resin layer forming step of, after the mixed resin preparation step but before the processing step, supplying the mixed resin to a support surface of a support table to form a resin layer with a predetermined thickness;
a protective-component forming step of, after the resin layer forming step but before the processing step, irradiating the resin layer with ultraviolet rays and curing the resin layer to form the sheet-shaped protective component; and
a protective-component-provided workpiece forming step of, after the protective component forming step but before the processing step, bringing the one surface of the sheet-shaped protective component being heated and the one surface of the substrate into contact with each other to form the protective-component-provided workpiece.

* * * * *